United States Patent
Aizawa et al.

(10) Patent No.: US 8,295,080 B2
(45) Date of Patent: Oct. 23, 2012

(54) SOLID-STATE MEMORY DEVICE, DATA PROCESSING SYSTEM, AND DATA PROCESSING DEVICE

(75) Inventors: Kazuo Aizawa, Tokyo (JP); Isamu Asano, Tokyo (JP); Junji Tominaga, Ibaraki (JP); Alexander Kolobov, Ibaraki (JP); Paul Fons, Ibaraki (JP); Robert Simpson, Ibaraki (JP)

(73) Assignee: Elpida Memory, Inc., Tokyo (JP)

( * ) Notice: Subject to any disclaimer, the term of this patent is extended or adjusted under 35 U.S.C. 154(b) by 327 days.

(21) Appl. No.: 12/794,077

(22) Filed: Jun. 4, 2010

(65) Prior Publication Data

US 2010/0315867 A1 Dec. 16, 2010

(30) Foreign Application Priority Data

Jun. 11, 2009 (JP) ................. 2009-140592

(51) Int. Cl.
*G11C 11/00* (2006.01)
(52) U.S. Cl. ......... 365/163; 365/100; 365/148; 977/754
(58) Field of Classification Search .................. 365/46, 365/94, 100, 113, 129, 148, 163; 257/2–5, 257/9, 296, 310, E21.35, E31.047, E27.006; 438/29, 95, 96, 166, 135, 240, 259, 365, 438/482, 486, 597, 785; 977/754
See application file for complete search history.

(56) References Cited

U.S. PATENT DOCUMENTS 6,198,225 B1 *  3/2001  Kano et al. .................. 315/169.3
2004/0188735 A1  9/2004  Hideki
2004/0192006 A1  9/2004  Campbell et al.
2007/0045606 A1  3/2007  Magistretti et al.
2007/0063180 A1  3/2007  Asano et al.
2008/0096386 A1  4/2008  Park et al.
2010/0181548 A1 *  7/2010  Tominaga et al. ................. 257/2
2010/0284218 A1 * 11/2010  Aizawa et al. ................. 365/174

FOREIGN PATENT DOCUMENTS

KR   10-2006-0132038   12/2006
KR   10-2007-0026157    3/2007
KR   10-2007-0028250    3/2007
KR   10-2008-0035844    4/2008

* cited by examiner

*Primary Examiner* — Alexander Sofocleous
*Assistant Examiner* — Harry W Byrne
(74) *Attorney, Agent, or Firm* — Young & Thompson

(57) ABSTRACT

A solid-state memory device includes: a superlattice laminate having plural crystal layers laminated therein, the crystal layers including first and second crystal layers having mutually opposite compositions; a lower electrode provided on a first surface in a laminating direction of the superlattice laminate; and an upper electrode provided on a second surface of the superlattice laminate in the laminating direction. The first crystal layer included in the superlattice laminate is made of a phase change compound. According to the present invention, the superlattice laminate laminated in opposite directions of the upper and lower electrodes is sandwiched between these electrodes. Therefore, when an electric energy is applied to the superlattice laminate via these electrodes, a uniform electric energy can be applied to a laminated surface of the superlattice laminate. Accordingly, fluctuation of a resistance is small even when information is repeatedly rewritten, and data can be read stably as a result.

24 Claims, 33 Drawing Sheets

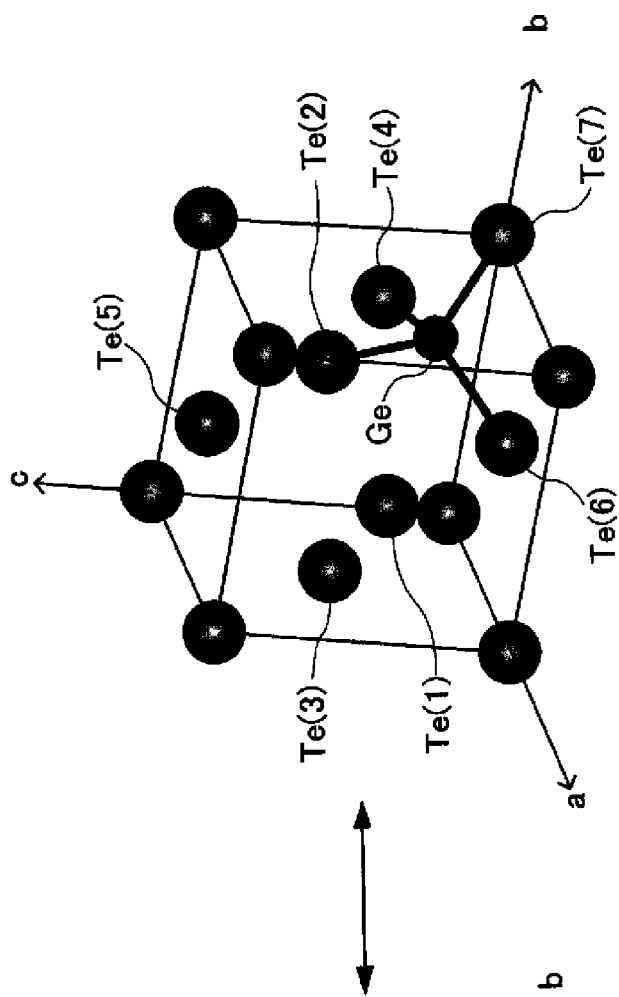
FIG.4A CRYSTAL STRUCTURE A
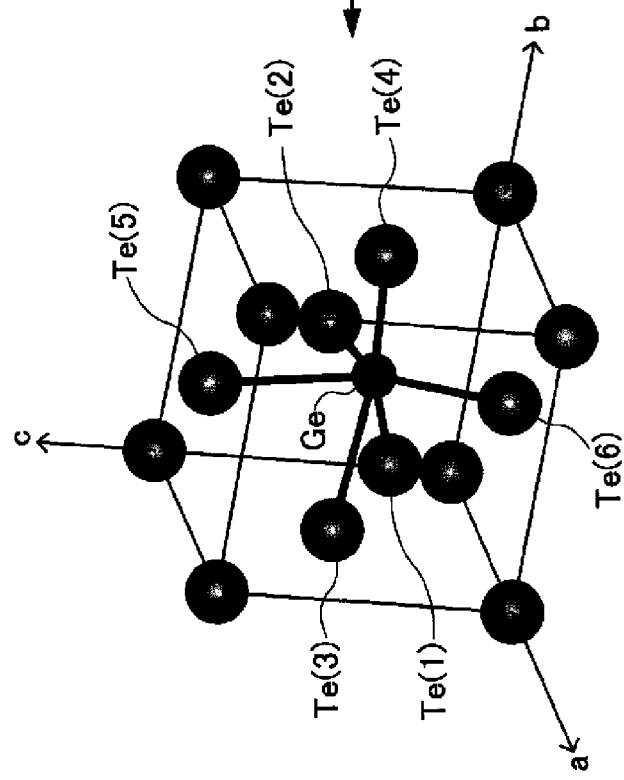
FIG.4B CRYSTAL STRUCTURE B

SOLID-STATE MEMORY DEVICE, DATA PROCESSING SYSTEM, AND DATA PROCESSING DEVICE

BACKGROUND OF THE INVENTION

1. Field of the Invention

The present invention relates to a solid-state memory device, and more particularly to a solid-state memory device using a superlattice device. The present invention also relates to a data processing system and a data processing device that include such a solid-state memory device.

2. Description of Related Art

In recent years, a semiconductor memory called PRAM (Phase change Random Access Memory) has been commanding attention. The PRAM is a semiconductor memory device using a phase change material as a material of a recording layer, and records therein information by using a difference between an electric resistance in a crystal phase and an electric resistance in an amorphous phase.

Specifically, when a chalcogenide compound is used for a phase change compound, an electric resistance becomes relatively low in a crystal phase, and an electric resistance becomes relatively high in an amorphous phase. Therefore, stored data can be read out as the electric resistance of a phase change compound is detected by passing a read current. Regarding data writing, a phase of a phase change compound can be changed to a crystal phase when the phase change compound is heated at or higher than a crystallization temperature and lower than a melting point during a certain period of time or more by passing a write current. On the other hand, the phase of the phase change compound can be changed to an amorphous phase when the phase change compound is heated at or higher than a melting point by passing a write current and is rapidly cooled thereafter.

However, a relatively large energy is necessary to change a phase of the phase change compound between an amorphous state and a crystal state. Therefore, a conventional PRAM has a problem that a large current is necessary at the time of rewriting data. To solve this problem, U.S. Patent Application Publication No. 2004/0188735 describes a technique of reducing a write current necessary to change a phase by configuring a recording layer to have a phase-change material layer and a high-resistance-phase-change material layer laminated alternately.

However, according to the technique of U.S. Patent Application Publication No. 2004/0188735, it is also difficult to greatly reduce the current required to change a phase because a phase of a part of the recording layer is changed between an amorphous state and a crystal state. Also, this conventional technique does not solve a problem of slow operation speed, because a relatively long time is required to change between an amorphous state and a crystal state.

Furthermore, according to the technique of U.S. Patent Application Publication No. 2004/0188735, a total phase of a part of the alternately laminated phase-change material layer and the high-resistance-phase change material layer ("region A" in the patent document) is changed. Therefore, repeated rewriting of data causes mixing of these materials. Such a change in the film quality of the recording layer degrades its characteristic and also reduces the number of rewritable times.

Basically, when a phase of a phase change material is changed between an amorphous state and a crystal state, it is difficult to control any of the states in a uniform state. For example, in a crystal state, there is generated many regions having crystal defects and disordered crystal-lattice arrangements, as well as crystal boundary regions or the like, and these states change each time when a phase changes. In this state, when a current is passed by applying a voltage to an electrode, the current flows in regions having crystal defects and disordered crystal-lattice arrangements, and in the crystal boundary regions. As a result, a current becomes uneven, and a current path changes each time when a phase is changed. Consequently, a resistance varies each time when a phase is changed, and this causes a problem such that data cannot be read correctly.

The present invention has been achieved to solve such problems.

SUMMARY

In one embodiment, there is provided a solid-state memory device comprising: first and second electrodes arranged to a first direction; and a superlattice laminate sandwiched between the first and second electrodes, the superlattice laminate having a plurality of crystal layers laminated one another, the crystal layers including first and second crystal layers having mutually different compositions, wherein at least a part of the superlattice laminate has an interface of the first and second crystal layers that intersects with the first direction, and the first crystal layer included in the superlattice laminate comprises a phase change material.

In the present invention, it is preferable that a crystal state of the first crystal layer included in the superlattice laminate is reversibly changed by applying an electric energy from the first and second electrodes. Particularly, it is more preferable that positions of constituent atoms of the first crystal layer included in the superlattice laminate are reversibly replaced by applying an electric energy from the first and second electrodes. In the present specification, for the sake of explanation, a change including a reversible change of a crystal state is sometimes called "phase change" in a broad sense.

A chalcogen compound containing germanium (Ge) and tellurium (Te) as main components can be mentioned as a material in which positions of constituent atoms are reversibly replaced. For example, in the case of a chalcogen compound containing germanium (Ge) and tellurium (Te) at a rate of 1:1, positions of constituent atoms are reversibly changed between a first crystal structure having one germanium atom orientated to four tellurium atoms and a second crystal structure having one germanium atom orientated to six tellurium atoms, based on a movement of a germanium atom due to energy application. Therefore, the material mentioned above is suitable for a material of the first crystal layer.

When the material is sandwiched by a chalcogen compound containing antimony (Sb) and tellurium (Te) as main components, a changing operation of the first crystal layer is assisted. Therefore, the chalcogen compound containing antimony (Sb) and tellurium (Te) as main components is suitable as a material of the second crystal layer.

According to the present invention, a superlattice laminate laminated in opposite directions of the first and second electrodes is sandwiched between these electrodes. Therefore, when an electric energy is applied to the superlattice laminate via these electrodes, the electric energy is applied in good reproducibility to a laminated surface of the superlattice laminate. That is, unlike bulk-shaped materials, the superlattice laminate hardly has regions having crystal defects and disordered crystal-lattice arrangements or crystal-boundary regions. Therefore, for example, when a current is passed between the first and second electrodes, a current path has no instability attributable to an uneven current in these regions, and the current flows substantially uniformly in good reproducibility to a laminated surface. Accordingly, its resistance will have very few fluctuations even when information is repeatedly rewritten, and data can be read stably as a result.

Because a superlattice laminate is used in the present invention, information is held by reversibly changing a crystal state. That is, because there is no amorphous state in the changing, the film quality or the like is hardly changed by repeating data rewriting. As a result, the number of rewritable times can be largely increased as compared with the number of rewritable times in conventional techniques.

BRIEF DESCRIPTION OF THE DRAWINGS

The above features and advantages of the present invention will be more apparent from the following description of certain preferred embodiments taken in conjunction with the accompanying drawings, in which:

FIGS. 4A and 4B are schematic diagrams for explaining a change in crystal structures of a chalcogen compound having germanium (Ge) and tellurium (Te) at a ratio of 1:1, where FIG. 4A shows a crystal structure A, and FIG. 4B shows a crystal structure;

FIG. 5A shows the crystal structure A, FIG. 5B shows the crystal structure B, and FIG. 5C shows a crystal structure in a transition from the crystal structure A to the crystal structure B (or vice versa);

FIG. 7A is a schematic cross-sectional view along a bit line direction (a Y direction), and FIG. 7B is a schematic cross-sectional view along a word line direction (an X direction);

FIG. 20A is a schematic cross-sectional view along a bit line direction (a Y direction), FIG. 20B is a schematic cross-sectional view along a word line direction (an X direction), and FIG. 20C is an enlarged schematic cross-sectional view of a region C shown in FIG. 20A;

FIG. 23A is a schematic cross-sectional view along a bit line direction (the Y direction), FIG. 23B is a schematic cross-sectional view along a word line direction (the X direction), and FIG. 23C is an enlarged schematic cross-sectional view of a region C shown in FIG. 23A;

FIG. 25A is a schematic cross-sectional view along a bit line direction (the Y direction), FIG. 25B is a schematic cross-sectional view along a word line direction (the X direction), and FIG. 25C is an enlarged schematic cross-sectional view of a region C shown in FIG. 25A;

FIG. 28A is a schematic cross-sectional view along a bit line direction (the Y direction), FIG. 28B is a schematic cross-sectional view along a word line direction (the X direction), and FIG. 28C is an enlarged schematic cross-sectional view of a region C shown in FIG. 28A;

FIG. 31A is a schematic cross-sectional view along a bit line direction (the Y direction), FIG. 31B is a schematic cross-sectional view along a word line direction (the X direction), and FIG. 31C is an enlarged schematic cross-sectional view of a region C shown in FIG. 31B;

FIG. 37A is a schematic cross-sectional view along a bit line direction (the Y direction), and FIG. 37B is a schematic cross-sectional view along a word line direction (the X direction);

DETAILED DESCRIPTION OF THE EMBODIMENTS

Preferred embodiments of the present invention will be explained below in detail with reference to the accompanying drawings.

Figure 1:
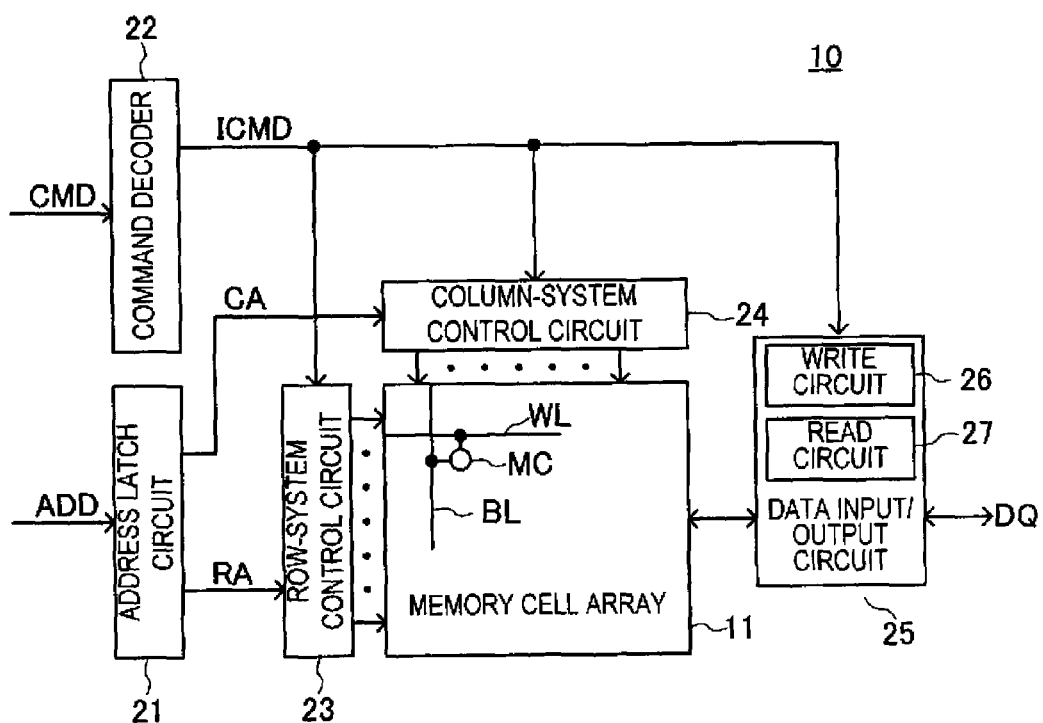
FIG. 1 is a block diagram of a semiconductor memory device 10 according to an embodiment of the present invention.

FIG. 1 is a block diagram of a semiconductor memory device 10 according to an embodiment of the present invention.

The semiconductor memory device 10 according to the present embodiment is a PRAM, and can access a memory cell array 11 including many memory cells MC by inputting an address signal ADD and a command CMD from outside. That is, when the command CMD indicates a read operation, data held in the memory cell MC assigned by the address signal ADD is read out. When the command CMD indicates a write operation, write data input from outside is written in the memory cell MC assigned by the address signal ADD.

This is explained more specifically. The semiconductor memory device 10 has an address latch circuit 21 that holds the address signal ADD, and a command decoder 22 that generates an internal command ICMD by decoding the command CMD. Among the address signals ADD input to the address latch circuit 21, a row address RA is supplied to a row-system control circuit 23, and a column address CA is supplied to a column-system control circuit 24. The row-system control circuit 23 is a circuit that selects a word line WL included in the memory cell array 11, based on the row address RA and the internal command ICMD. The column-system control circuit 24 is a circuit that selects a bit line BL included in the memory cell array 11, based on the column address CA and the internal command ICMD.

The selected bit line BL is connected to a data input/output circuit 25. As a result, when the command CMD indicates a read operation, read data DQ held in the memory cell MC assigned by the address signal ADD is read out, via the data input/output circuit 25. When the command CMD indicates a write operation, write data DQ input from outside is written in the memory cell MC assigned by the address signal ADD, via the data input/output circuit 25.

Figure 2:
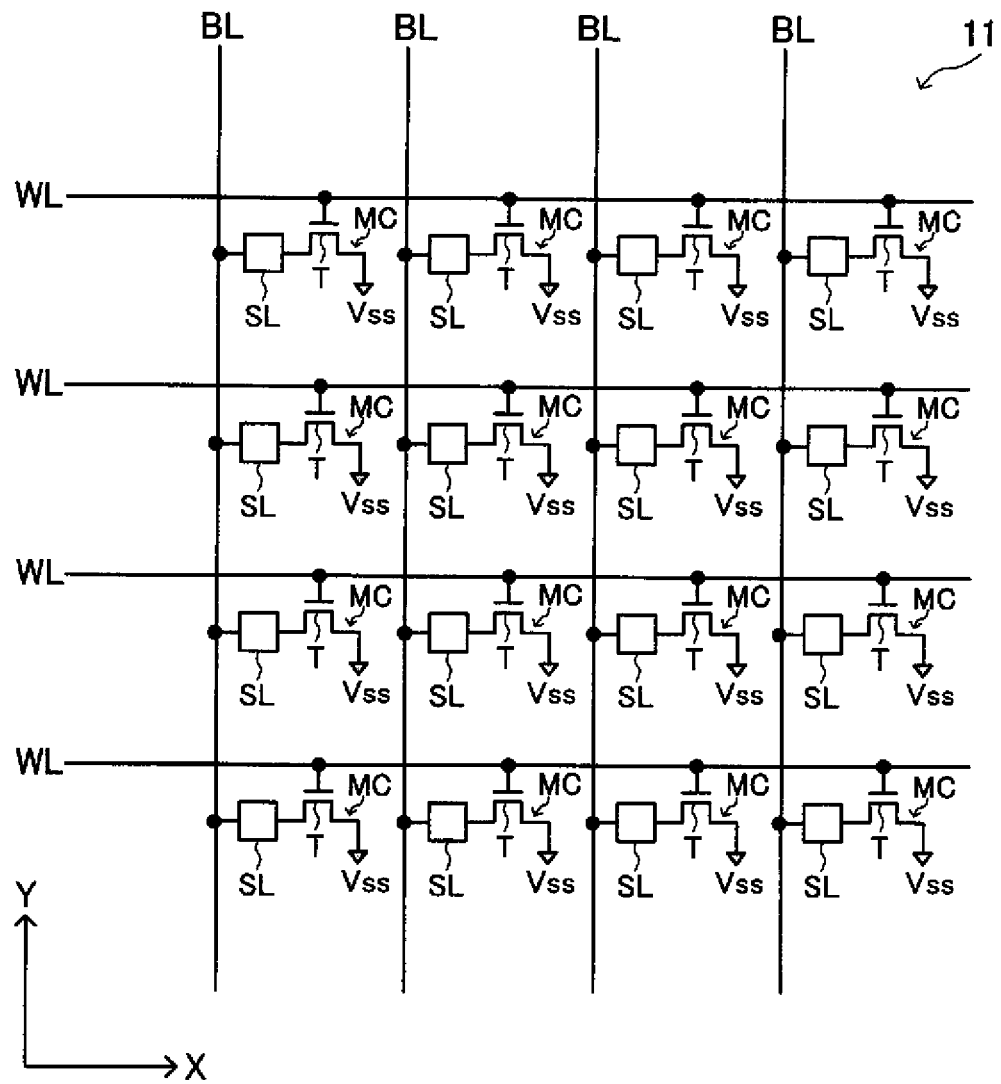
FIG. 2 is a circuit diagram showing a part of the memory cell array 11 in detail.

FIG. 2 is a circuit diagram showing a part of the memory cell array 11 in detail.

As shown in FIG. 2, plural word lines WL are provided in the X direction, and plural bit lines BL are provided in the Y direction, in the memory cell array 11. The memory cell MC is arranged at each of intersections between the word line WL and the bit line BL. With this arrangement, plural memory cells MC are laid out in a matrix shape. Each of the memory cells MC shown in FIG. 2 includes a superlattice laminate SL as a memory element, and a MOS transistor T as a switching device, and these are connected in series between a corresponding bit line BL and a ground line Vss. A gate electrode of the MOS transistor T is connected to a corresponding word line WL. In the example shown in FIG. 2, although the superlattice laminate SL is connected to a bit line BL side, and the MOS transistor T is connected to a ground line Vss side, these can be connected reversely.

Figure 3:
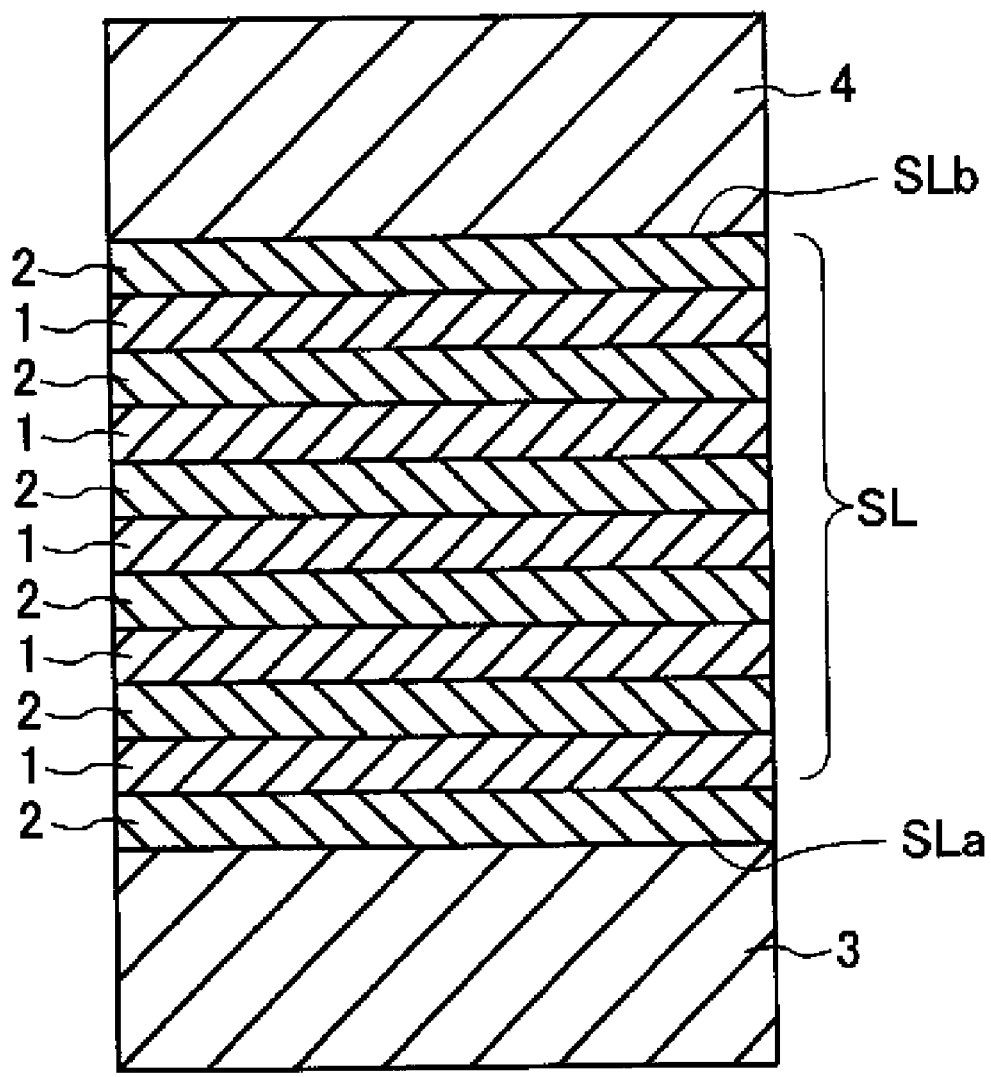
FIG. 3 is across-sectional view showing a configuration of the superlattice laminate SL according to a first embodiment of the present invention.

FIG. 3 is a cross-sectional view showing a configuration of the superlattice laminate SL according to a first embodiment of the present invention.

As shown in FIG. 3, the superlattice laminate SL used for a memory element according to the first embodiment has a crystal layer 1 and a crystal layer 2 laminated alternately in plural layers. A lower electrode 3 is provided on one surface SLa of the superlattice laminate SL in its laminating direction, and an upper electrode 4 is provided on the other surface SLb of the superlattice laminate SL in its laminating direction. That is, the superlattice laminate SL is sandwiched between these electrodes 3 and 4, and a laminating direction of the superlattice laminate SL coincides with opposite directions of the electrodes 3 and 4.

In this configuration, when a current is passed to the superlattice laminate SL via the electrodes 3 and 4, the current flows to a laminating direction of the superlattice laminate SL. Unlike bulk-shaped materials, the superlattice laminate SL hardly has regions having crystal defects and disordered crystal-lattice arrangements or crystal boundary regions. Therefore, a current path has no instability attributable to a current unevenly present in these regions, and the current flows substantially uniformly in good reproducibility to the laminated surface.

The electrodes 3 and 4 are made of conductors. As specific materials, there are metal materials such as aluminum (Al), tungsten (W), titanium (Ti), metal nitride such as titanium nitride (TiN) and tungsten nitride (WN), metal silicide such as titanium silicide (TiSi) and cobalt silicide (CoSi), and polycrystalline silicon doped with an n-type or p-type impurity. Materials of the electrodes 3 and 4 do not need to be the same, and can be different from each other.

The crystal layer 1 is made of a phase change compound. Particularly, it is preferable that the crystal layer 1 is a phase change material, a crystal state of which is reversibly changed due to energy application. "Crystal state is reversibly changed" is a concept including a case that a crystal lattice itself changes, a case that the coordination number of atoms contained in crystals changes while maintaining a basic structure of a crystal lattice, and a case that a distance between predetermined atoms changes although a basic structure of a crystal lattice and the coordination number of atoms do not change. It is sufficient that a crystal state can be changed between stable two or more crystal structures at least at a normal temperature.

Particularly, it is more preferable that the crystal layer 1 has positions of constituent atoms reversibly replaced by energy application. "Positions of constituent atoms reversibly replaced" is a concept including a case that the coordination number of atoms contained in crystals changes while maintaining a basic structure of a crystal lattice, and a case that a distance between predetermined atoms changes although a basic structure of a crystal lattice and the coordination number of atoms do not change. It is sufficient that a crystal state can be transited between stable two or more crystal structures at least at a normal temperature.

As this material, a chalcogen compound of an NaCl cubical crystal containing germanium (Ge) as a main component is mentioned. When a laminated surface is (111)-orientated, positions of constituent atoms are reversibly replaced by applying a relatively small energy.

There are plural stable positions of germanium atoms in a chalcogen compound of an NaCl-type cubic crystal containing germanium (Ge) as a main component. Therefore, in this compound, positions of germanium atoms can be reversibly moved by applying an energy by (111)-orientating a laminated surface. Specifically, when a chalcogen compound has germanium (Ge) and tellurium (Te) as main components, application of energy to the chalcogen compound does not substantially change positions of tellurium atoms but changes positions of germanium atoms. Further, because there is no remarkable difference between energy stability of crystals before a positional change of germanium atoms and energy stability of crystals after the positional change, positions of germanium atoms can be reversibly moved easily. This phenomenon occurs in good reproducibility when the ratio of germanium (Ge) to tellurium (Te) is set to be 1:1.

A chalcogen compound of an NaCl-type cubic crystal containing aluminum (Al) as a main component (for example, AlTe) can be also used as a material of the crystal layer 1. The chalcogen compound containing aluminum (Al) as a main component can have its aluminum atom positions changed by applying an energy to this chalcogen compound. According to a result of simulation based on a quantum-mechanical calculation, a difference between energy stability of crystals before a positional change of aluminum atoms and energy stability of crystals after the positional change is relatively large. Therefore, application of a relatively large energy is considered necessary to reversibly move positions of aluminum atoms.

Besides, according to a result of simulation based on a quantum-mechanical calculation, a chalcogen compound of SiTe and CTe and the like has a remarkably large difference between energy stability of crystals before a positional change of these atoms and energy stability of crystals after the positional change. Therefore, it is considered difficult to reversibly move positions of silicon atoms and carbon atoms. Accordingly, a chalcogen compound of SiTe and CTe and the like is not suitable as a material of the crystal layer 1.

The "main component" means an element forming a basic unit lattice of each crystal layer.

FIGS. 4A and 4B are schematic diagrams for explaining a change in crystal structures of a chalcogen compound having germanium (Ge) and tellurium (Te) at a ratio of 1:1, where FIG. 4A shows a crystal structure A, and FIG. 4B shows a crystal structure B.

As shown in FIG. 4A, in the crystal structure A, one germanium atom at a center is orientated to six tellurium atoms Te(1) to Te(6) at front, back, left, right, up, and down positions out of tellurium atoms constituting an NaCl-type cubic lattice. In FIG. 4A, Te(1) is a tellurium atom positioned on a front surface of the lattice, Te(2) is a tellurium atom positioned on a back surface of the lattice, Te(3) is a tellurium atom positioned on a left surface of the lattice, Te(4) is a tellurium atom positioned on a right surface of the lattice, Te(5) is a tellurium atom positioned on an upper surface of the lattice, and Te(6) is a tellurium atom positioned on a lower surface of the lattice. This is a stable structure, and this structure does not change unless a predetermined energy or a higher energy is applied to the lattice from outside. In FIG. 4, the chalcogen compound is described as a lattice of the NaCl type where Te is arranged outside. To explain the movement of Ge plainly, only the Ge atom at the center is described. Further, Ge atom located in the middle of timber which connects Te and Te, that is, Ge atom located at b-site is omitted so as not to disturb understanding. In the crystal structure A shown in FIG. 4A, electric resistance becomes relatively low. In a PRAM, a state that a chalcogen compound has a low resistance is called "set state". Therefore, a state that the crystal layer 1 is in the crystal structure A is also called "set state" in the present specification.

On the other hand, in the crystal structure B shown in FIG. 4B, one germanium atom at a center is orientated to four tellurium atoms Te. Specifically, as compared with the crystal structure A, this germanium atom is not orientated to Te(1), Te(3), and Te(5), and is orientated to Te(7). In FIG. 4B, Te(7) is a tellurium atom positioned at a right lower back corner of the lattice. This structure is also stable, and does not change unless a predetermined energy or a higher energy is applied to the lattice from outside. An electric resistance becomes relatively high in the crystal structure B shown in FIG. 4B. In a PRAM, a state that a chalcogen compound has a high resistance is called "reset state". Therefore, a state that the crystal layer 1 is in the crystal structure B is also called "reset state" in the present specification.

A transition from the crystal structure A to the crystal structure B (a reset operation), and a transition from the crystal structure B to the crystal structure A (a set operation) are performed by applying an electric energy to the lattice via the bit line BL shown in FIG. 2. A transition from the crystal structure A to the crystal structure B requires a relatively high energy. According to results of experiments and simulations, an energy of 2.7 eV is necessary for this transition. On the other hand, a transition from the crystal structure B to the crystal structure A requires a relatively low energy. According to results of experiments and simulations, an energy of 2.3 eV is necessary for this transition. That is, when an energy necessary to change from the crystal structure A to the crystal structure B is E1 and also when an energy necessary to change from the crystal structure B to the crystal structure A is E2, a relationship of E1>E2 is established. Therefore, regardless of a crystal structure before transition, the possibility of the transition to the crystal structure B becomes high when an energy exceeding E1 is applied, and the possibility of the transition to the crystal structure A becomes high when an energy exceeding E2 and lower than E1 is applied.

Referring back to FIG. 3, the crystal layers 2 have different compositions from those of the crystal layers 1, and assist the crystal layers 1 to perform the transition operation described above, by sandwiching the crystal layer 1 between the crystal layers 2 in a laminated direction. Therefore, a crystal structure of the crystal layers 2 does not need to change. Note that there is no problem if the transition in the crystal structure of the crystal layers 2 occurs.

A crystal lattice of the crystal layer 2 is a hexagonal crystal, and a c-axis of the crystal layer 2 is preferably orientated to the laminated direction. Based on this, a cavity region contributing to a movement of atoms contained in the crystal layer 1 is formed in each crystal lattice of the crystal layer 2, and the transition operation of the crystal layer 1 described above becomes easy. Specifically, a chalcogen compound containing antimony (Sb) as a main component can be mentioned for a material of the crystal layer 2. When the crystal layer 1 is made of a chalcogen compound containing germanium (Ge) and tellurium (Te) as main components, it is preferable that the crystal layer 2 is made of a chalcogen compound containing antimony (Sb) and tellurium (Te) as main components or a chalcogen compound containing bismuth (Bi) and tellurium (Te) as main components. Most preferably, the crystal layer 2 is made of a chalcogen compound containing antimony (Sb) and tellurium (Te) as main components.

More specifically, when a chalcogen compound (GeTe) containing germanium (Ge) and tellurium (Te) at a ratio of 1:1 is used as a material of the crystal layer 1, it is preferable to use a chalcogen compound ($Sb_2Te_3$) containing antimony (Sb) and tellurium (Te) at a ratio of 2:3 as a material of the crystal layer 2.

Figures 5A, 5B, 5C:
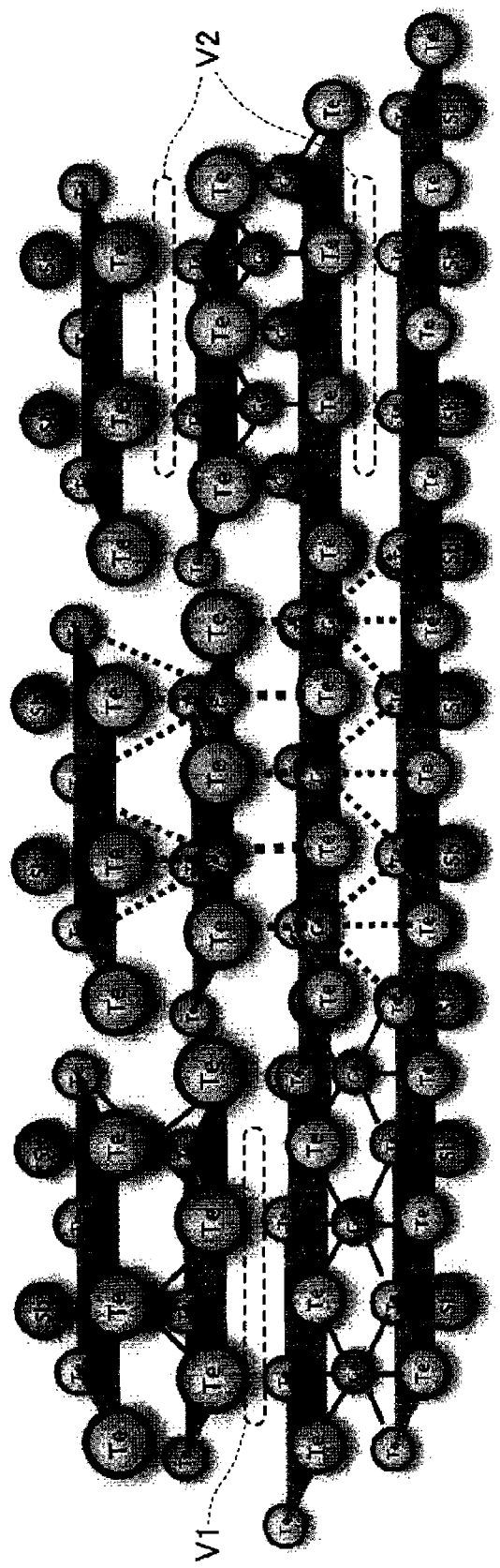
FIGS. 5A to 5C are schematic diagrams for explaining a change in a crystal structure when GeTe is used for a material of the crystal layer 1 and also when $Sb_2Te_3$ is used for a material of the crystal layer 2, where

FIGS. 5A to 5C are schematic diagrams for explaining a change in a crystal structure when GeTe is used for a material of the crystal layer 1 and also when $Sb_2Te_3$ is used for a material of the crystal layer 2, where FIG. 5A shows the crystal structure A, FIG. 5B shows the crystal structure B, and FIG. 5C shows a crystal structure in a transition from the crystal structure A to the crystal structure B (or vice versa).

As shown in FIG. 5A, when the crystal layer 1 takes the crystal structure A, germanium atoms are positioned slightly deviated from the center of an NaCl-type cubic lattice configured by tellurium atoms. Accordingly, a cavity region V1 is generated between tellurium atoms at corners of the NaCl-type cubic lattice and the germanium atoms. On the other hand, as shown in FIG. 5B, when the crystal layer 1 takes the crystal structure B, germanium atoms are positioned to take a regular tetrahedral structure with tellurium atoms at corners and tellurium atoms positioned at centers of three surfaces surrounding these tellurium atoms, thereby generating cavity regions V2. That is, positions of germanium atoms are replaced with positions of cavity regions. In this way, germanium atoms of the crystal structure B are arranged in the cavity region V1 generated in the crystal structure A, and conversely, germanium atoms of the crystal structure A are arranged in the cavity regions V2 generated in the crystal structure B. With this arrangement, stable crystal structures are changed to each other.

The number of crystal lattices of each of the crystal layers 1 and 2 in a laminated direction is not particularly limited so far as the number is equal to or larger than one. That is, each of the crystal layers 1 and 2 can be configured by a crystal lattice of one layer or can be configured by crystal lattices of two or more layers. Therefore, when a crystal lattice of one layer constituting the crystal layer 1 is expressed as [1] and also when a crystal lattice of one layer constituting the crystal layer 2 is expressed as [2], one crystal layer can be laminated alternately such as [12121212 ... ], or two crystal layers can be laminated alternately such as [11221122 ... ].

The number of crystal lattices in each crystal layer 1 in a laminated direction does not need to match the number of crystal lattices in each crystal layer 2 in a laminated direction. Therefore, the ratio of numbers of crystal lattices between the crystal layer 1 and the crystal layer 2 can be 1:2 such as [122122122 ... ], and the ratio of numbers of crystal lattices between the crystal layer 1 and the crystal layer 2 can be 1:4 such as [1222212222 ... ]. The number of lattices of each crystal layer 1 in a laminated direction does not need to be the same, and the number of lattices of each crystal layer 2 in a laminated direction does not need to be the same. Therefore, these crystal layers can be laminated in order of [122112122 ... ], for example.

However, because positions of constituent atoms of the crystal layer 1 are reversibly replaced, coherence is excellent when the number of crystal lattices of each crystal layer 1 in a laminated direction is smaller. A high-speed transition operation can be performed with a smaller number of crystal lattices. Taking this feature into consideration, it is preferable that each crystal layer 1 is configured by crystal lattices of one layer. That is, it is preferable to arrange each crystal layer 1 such as [12121212 ... ], [122122122 ... ], and [1222212222 ... ], for example.

Figure 6:
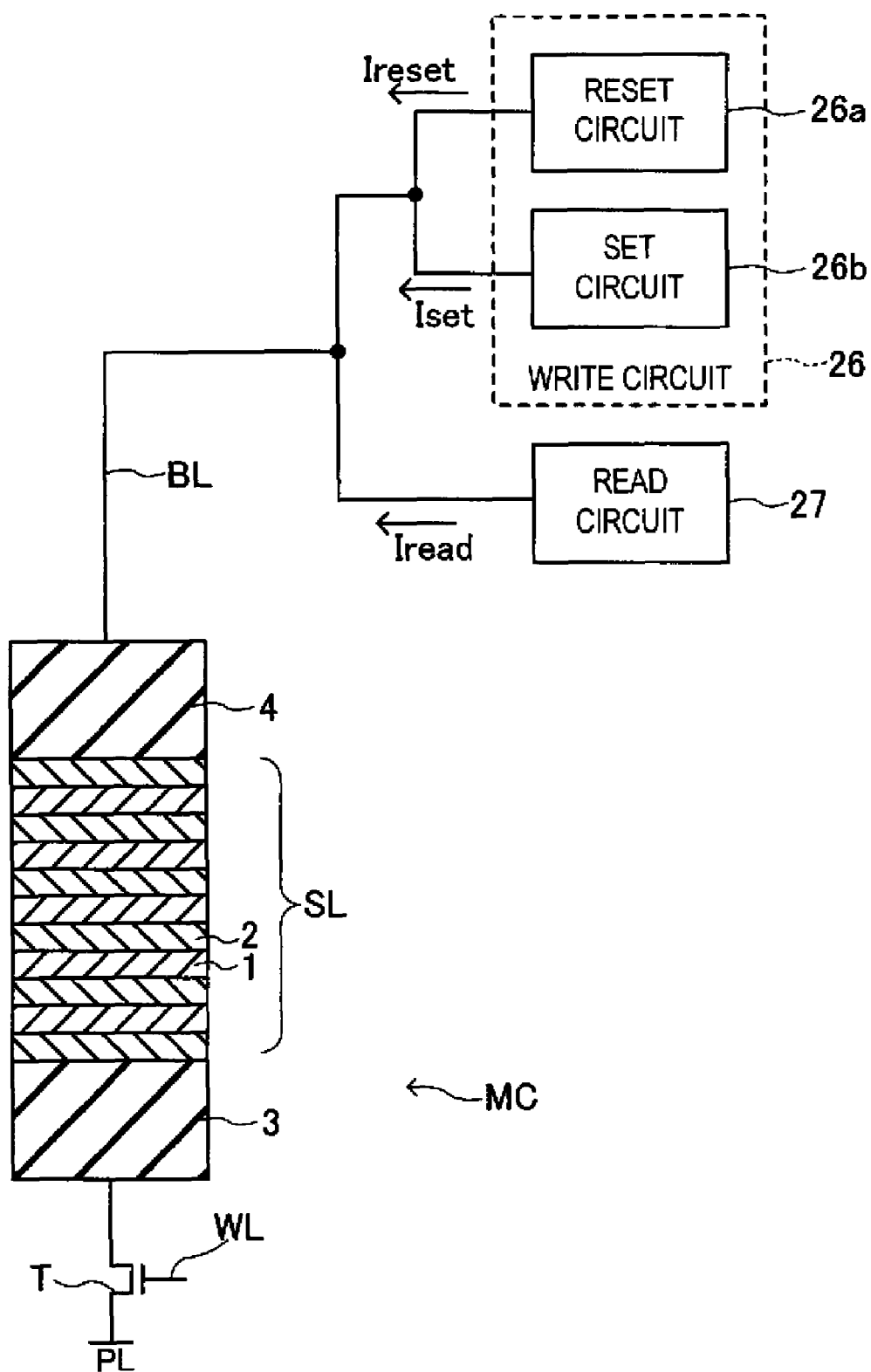
FIG. 6 is a schematic diagram for explaining a relation of connection between a memory cell MC and a write circuit 26 and a read circuit 27.

FIG. 6 is a schematic diagram for explaining a relation of connection between a memory cell MC and a write circuit 26 and a read circuit 27.

As shown in FIG. 6, the superlattice laminate SL included in the memory cell MC is connected to the write circuit 26 and the read circuit 27 via the upper electrode 4 and the bit line BL. The write circuit 26 and the read circuit 27 are circuit blocks included in the data input/output circuit 25 shown in FIG. 1.

The write circuit 26 includes a reset circuit 26a and a set circuit 26b. As described above, a state that the crystal layer 1 is in the crystal structure A is a set state, and a state that the crystal layer 1 is in the crystal structure B is a reset state. The reset circuit 26a causes the crystal layer 1 to change from the crystal structure A (a set state) to the crystal structure B (a reset state). On the other hand, the set circuit 26b causes the crystal layer 1 to change from the crystal structure B (a reset state) to the crystal structure A (a set state).

The reset circuit 26a gives the superlattice laminate SL an energy exceeding an energy E1 necessary for the crystal layer 1 to change from the crystal structure A to the crystal structure B. This energy is given by a reset current Ireset. On the other hand, the set circuit 26b gives the superlattice laminate SL an energy exceeding an energy E2 necessary for the crystal layer 1 to change from the crystal structure B to the crystal structure A and lower than E1. This energy is given by a set current Iset. An energy amount given to the superlattice laminate SL can be adjusted by a current amount flowed to the superlattice laminate SL. Therefore, Ireset>Iset is established in this example.

As shown in FIG. 6, because the lower electrode 3 and the upper electrode 4 are provided to sandwich the superlattice device SL in a laminated direction, when the set current Iset or the reset current Ireset flows to the superlattice laminate SL by using the write circuit 21 in a state that the transistor T is on, a direction of the current flow becomes parallel to a laminated direction of the superlattice laminate SL. Accordingly, an energy is applied to the superlattice laminate SL in a laminated direction. As a result, the applied energy is efficiently used to change a crystal structure.

Meanwhile, according to a conventional bulk-shaped phase-change material, most of applied energy is consumed to increase entropy, and only little energy is used to change a crystal structure. Therefore, the conventional solid-state memory device has a problem such that a relatively large energy is necessary to cause a phase change and that a relatively long time is necessary for a phase change. In contrast, according to the present embodiment, because its atom arrangement has coherence, most of applied energy is used to change a crystal structure. Therefore, according to a solid-state memory device in the present embodiment, an energy necessary to change a crystal structure is smaller than that conventionally required. Further, the time necessary to change a crystal structure is shorter than that conventionally required.

A phase change speed is measured for a case of using a superlattice laminate SL using GeTe for a material of the crystal layer 1 and using $Sb_2Te_3$ for a material of the crystal layer 2, and for a case of using a chalcogenide compound of a conventional bulk-shaped $Ge_2Sb_2Te_5$ composition, respectively, by using a test device of the same structure in a heater size of approximately 70 nm. As a result, it is confirmed that the bulk-shaped chalcogenide compound has a phase change speed of approximately 200 to 300 ns, and the superlattice laminate SL has high performance of approximately 30 to 40 ns which is approximately 1/5 to 1/8 of a conventional speed. This result indicates that, when the superlattice laminate SL is used, a transition between the crystal structure A and the crystal structure B is at a remarkably higher speed than that of a transition between an amorphous and a crystal when the conventional bulk-shaped chalcogenide compound is used. A solid-state memory device using the superlattice laminate SL can considerably shorten a current pulse width at a set time and a reset time, and can achieve a high speed operation. Therefore, substantial power consumption can be largely reduced.

The read circuit 27 functions to flow the read current Iread to the superlattice laminate SL without causing the crystal layer 1 to change a crystal structure. As described above, an electric resistance is relatively low in the crystal structure A, and an electric resistance is relatively high in the crystal structure B. Therefore, when an electric resistance is measured by flowing the read current Iread to the superlattice laminate SL in a state that the transistor T is on, it can be determined whether the crystal layer 1 has the crystal structure A or the crystal structure B. An energy given to the superlattice laminate SL is set to be equal to or smaller than E2 by the read current Iread. That is, a current is set as Iread<<Iset. Therefore, even when the read current Iread is flowed to the superlattice laminate SL, a crystal structure of the crystal layer 1 is not changed. That is, nondestructive reading is performed.

As explained above, in the first embodiment, plural memory cells MC are laid out in a matrix shape, and the superlattice laminate SL is sandwiched between the electrodes 3 and 4 in a laminating direction as a memory element included in the memory cell MC. Therefore, a large-capacitance solid-state memory device can be provided in a similar manner to that of a DRAM (Dynamic Random Access Memory) or the like. Because a crystal structure of the crystal layer 1 included in the superlattice laminate SL is not transited unless a predetermined energy is applied via the bit line BL, the memory can store data as nonvolatile data, unlike the DRAM. According to the superlattice laminate SL of the first embodiment, a crystal structure is transited at a high speed in a smaller energy than that required by a conventional PRAM. Therefore, both low power consumption and high-speed operation can be achieved.

A device configuration of the memory cells MC is explained next.

Figure 7A:
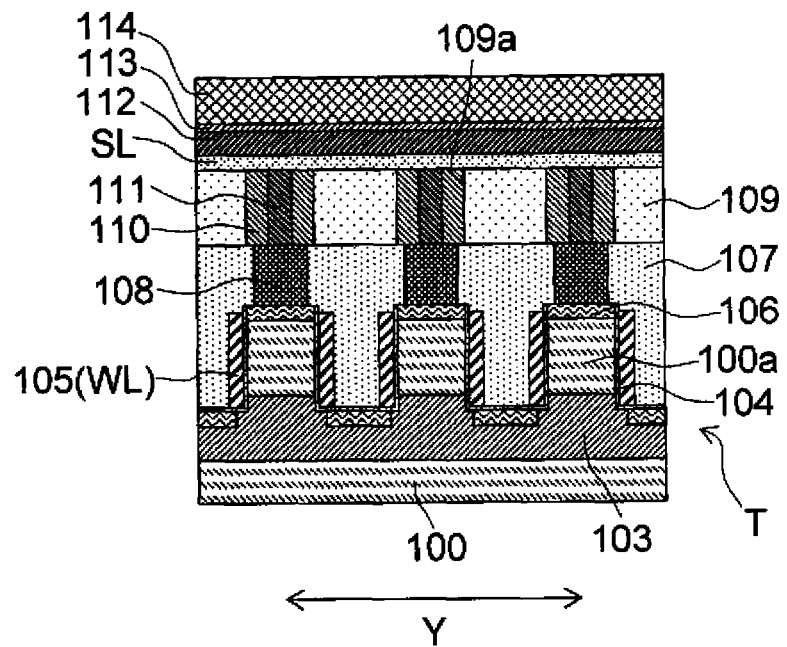
FIGS. 7A and 7B show a device configuration of the memory cells MC according to the first embodiment, where
Figure 7B:
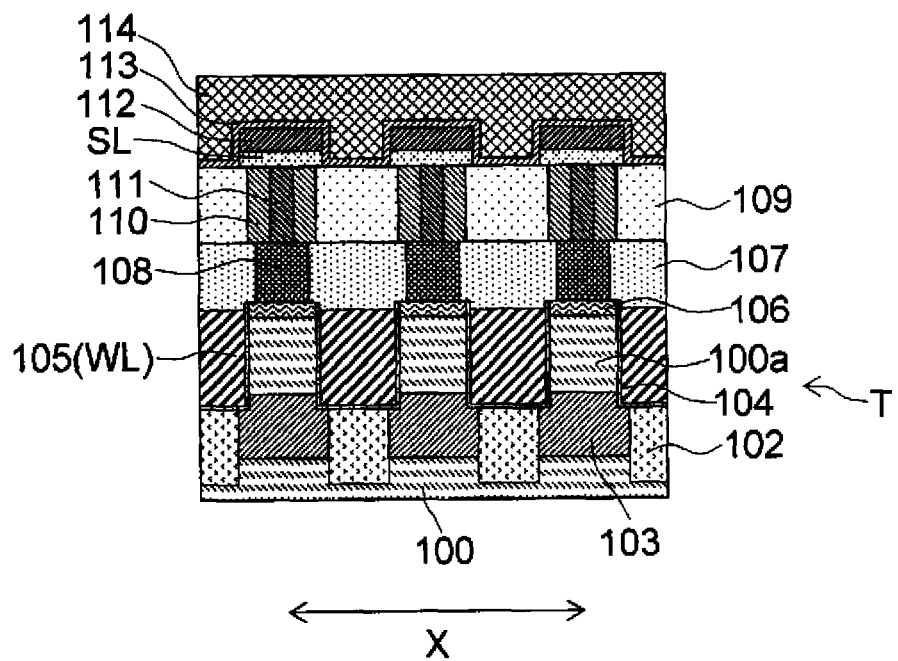

FIGS. 7A and 7B show a device configuration of the memory cells MC according to the first embodiment, where FIG. 7A is a schematic cross-sectional view along a bit line direction (a Y direction), and FIG. 7B is a schematic cross-sectional view along a word line direction (an X direction).

The memory cells MC shown in FIGS. 7A and 7B include vertical MOS transistors T having as channels silicon pillars 100a, as a part of a semiconductor substrate 100, projected in a direction perpendicular to a main surface of the semiconductor substrate 100, and the superlattice laminates SL connected to one of a source or drain of the transistor T. A P-type impurity is doped in a center of the silicon pillars 100a in a height direction.

The silicon pillars 100a adjacent in the X direction are isolated by element isolation regions 102 extended to the Y direction and by gate electrodes 105 (the word lines WL). The silicon pillars 100a adjacent in the Y direction are isolated by interlayer insulation film 107. Surrounding of the silicon pillars 100a is covered by the gate electrodes 105 via gate insulation films 104. Out of these gate electrodes 105, portions covering the silicon pillars 100a adjacent in the X direction are short-circuited to each other. On the other hand, portions covering the silicon pillars 100a adjacent in the Y direction are isolated from each other by the interlayer insulation film 107.

N-type diffusion layers 103 extended to the Y direction are provided at lower parts of the silicon pillars 100a. The N-type diffusion layers 103 adjacent in the X direction are isolated by the element isolation regions 102. N-type diffusion layers 106 are provided at upper parts of the silicon pillars 100a. With this arrangement, when a predetermined voltage is applied to the gate electrodes 105, the vertical MOS transistors T having the silicon pillars 100a as channels are turned on, and the N-type diffusion layers 103 and the N-type diffusion layers 106 become in a conductive state.

Upper surfaces of the N-type diffusion layers 106 are connected to contact plugs 108. Upper surfaces of the contact plugs 108 and the interlayer insulation film 107 configure a flat surface. Interlayer insulation film 109 is provided on the interlayer insulation film 107. Through-holes 109a are formed in the interlayer insulation film 109, respectively, and sidewall insulation films 110 are provided to cover inner walls of the through-holes 109a, respectively. Heater electrodes 111 are embedded in cylindrical regions surrounded by the sidewall insulation films 110, respectively. Each of the heater electrodes 111 functions as the lower electrode 3 shown in FIG. 3. Lower parts of the heater electrodes 111 are connected to the contact plugs 108, respectively.

Upper surface of the interlayer insulation film 109, the sidewall insulation films 110, and the heater electrodes 111, form a flat surface. The superlattice laminates SL and upper electrodes 112 (the bit lines BL) extended to the Y direction are provided on the interlayer insulation film. 109. In the first embodiment, each of the laminated surface of the superlattice laminates SL is a flat surface, and is substantially parallel to the main surface of the semiconductor substrate 100. Each of the upper electrodes 112 corresponds to the upper electrode 4 shown in FIG. 3. A protection insulation film 113 is provided on the whole surface of the interlayer insulation film 109 formed with the upper electrodes 112. An interlayer insulation film 114 is provided on an upper surface of the protection insulation film 113.

The device configuration of the memory cells MC according to the first embodiment is as explained above. In the first embodiment, because the laminated surface of the superlattice laminates SL is a flat surface, the superlattice laminates SL with a remarkably small number of crystal disorders can be formed easily. Because the heater electrodes 111 are embedded in the regions surrounded by the sidewall insulation films 110, respectively, each diameter of the heater electrodes 111 can be made smaller than a resolution limit of lithography. Consequently, a current path can be limited in the region opposite to the heater electrode 111 and the upper electrode 112, and a phase change region can be made small, thereby further reducing a set current and a reset current.

A manufacturing process of the memory cells MC according to the first embodiment is explained next.

FIG. 8 to FIG. 17 are process diagrams showing the manufacturing process of the memory cells MC according to the first embodiment. FIGS. 8A, 9A, 10A, and 11A are schematic plan views, and FIGS. 8B and 10B, and 11B are schematic cross-sectional views along a line A-A (the Y direction). FIGS. 9B, 10C, and 11C are schematic cross-sectional views along a line B-B (the X direction).

Figure 8A:
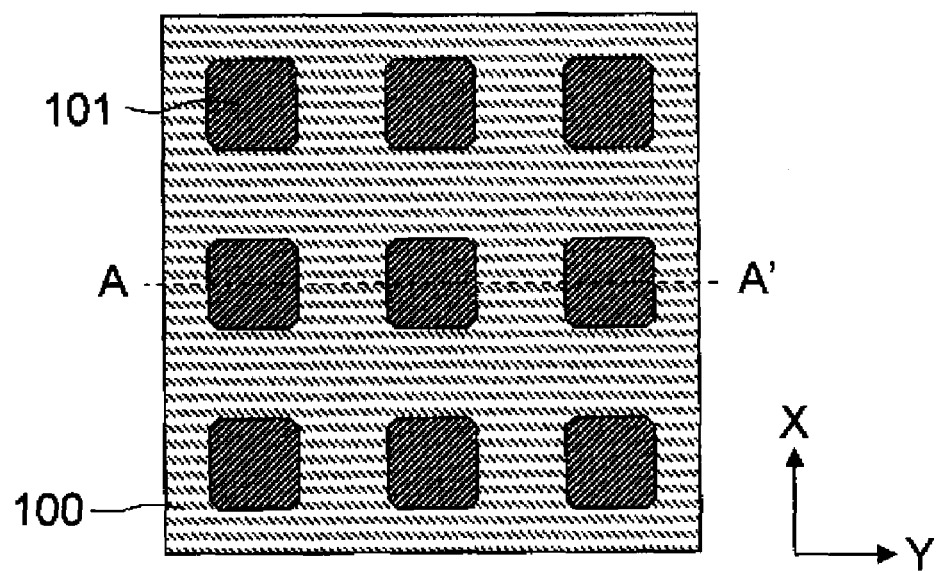
FIGS. 8A and 8B are process diagrams (forming silicon pillars 100a) showing a manufacturing process of the memory cell MC according to the first embodiment.
Figure 8B:
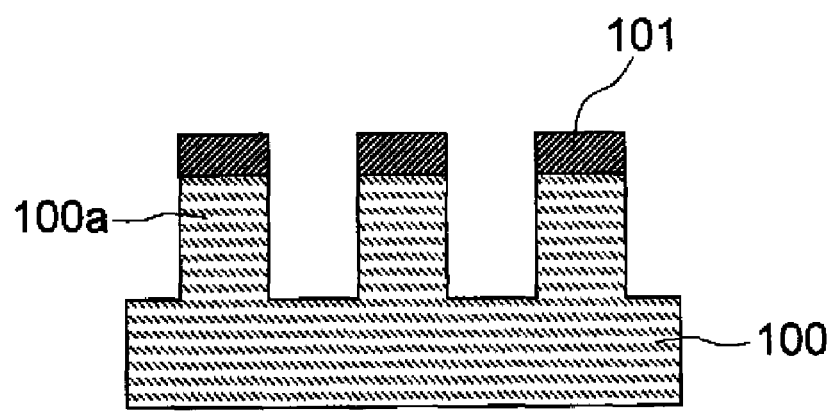

First, the semiconductor substrate 100 doped with P-type impurities is prepared, and island-shaped mask nitride films 101 are formed on the surface of the semiconductor substrate 100 as shown in FIGS. 8A and 8B. Preferably, a diameter of each of the mask nitride film. 101 is approximately 50 nm, and an interval between the mask nitride films 101 adjacent to each other is approximately 50 nm. Next, the semiconductor substrate 100 is etched by approximately 200 nm by using the mask nitride films 101, thereby forming the silicon pillars 100a on the semiconductor substrate 100.

Figure 9A:
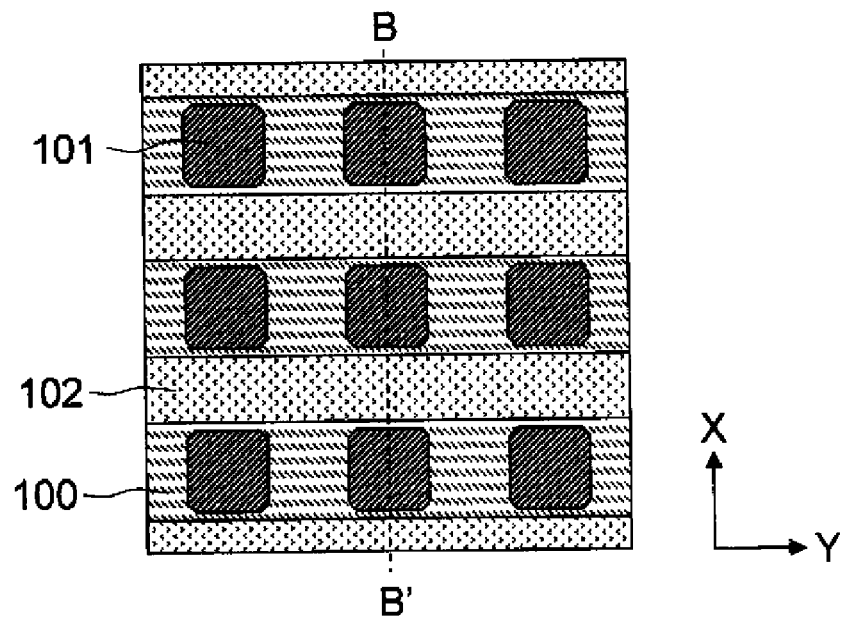
FIGS. 9A and 9B are process diagrams (forming element isolation regions 102) showing a manufacturing process of the memory cell MC according to the first embodiment.
Figure 9B:
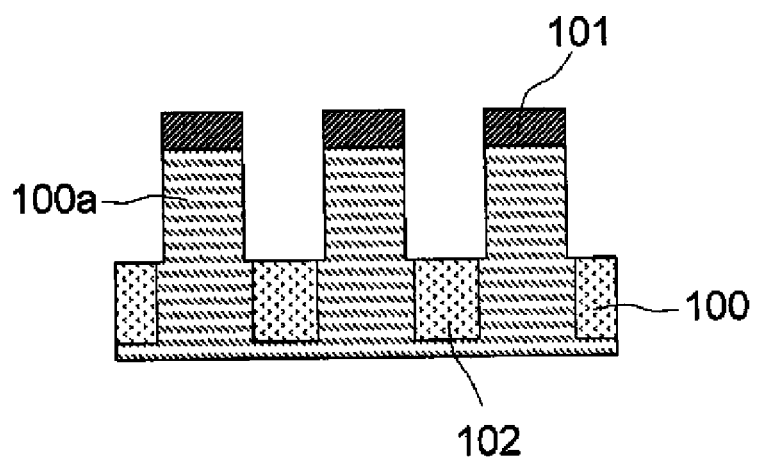

Next, as shown in FIGS. 9A and 9B, element isolation trenches extended to the Y direction are formed in the semiconductor substrate 100 positioned between the silicon pillars 100a adjacent in the X direction. These trenches are embedded with silicon oxide films, thereby forming element isolation regions 102.

Figure 10A:
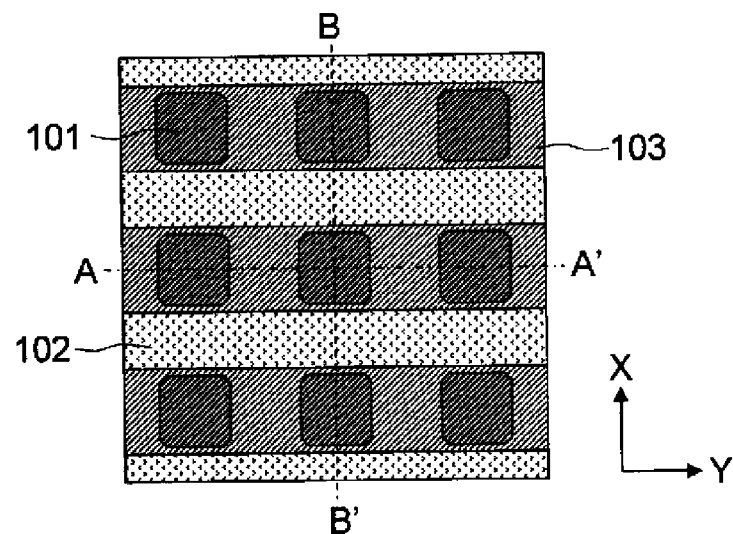
FIGS. 10A to 10C are process diagrams (forming N-type diffusion layers 103) showing a manufacturing process of the memory cell MC according to the first embodiment.
Figure 10B:
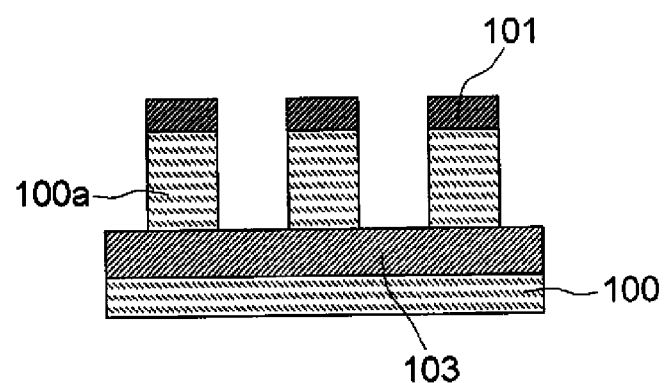
Figure 10C:
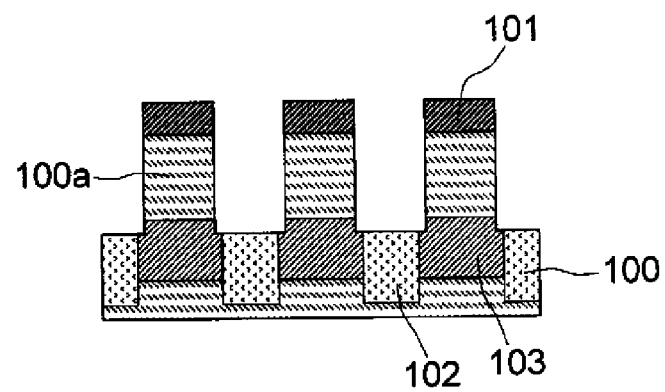

Next, as shown in FIGS. 10A to 10C, N-type impurities such as phosphorus are ion implanted into the semiconductor substrate 100. As a result, the N-type diffusion layers 103 are formed in the surface of the semiconductor substrate 100 exposed between the silicon pillars 100a. When phosphorus is used for the impurity, a dose amount of approximately $2 \times 10^{15}$ atoms/cm$^2$ is sufficient. Thereafter, an activation heating process is performed, thereby diffusing the N-type impurities to a longitudinal direction (a thickness direction) and a lateral direction (a direction parallel to the main surface) of the semiconductor substrate 100. As a result, the N-type impurities are diffused to a lower part of the silicon pillars 100a, and the N-type diffusion layers 103 extended to the Y direction are formed.

Figure 11A:
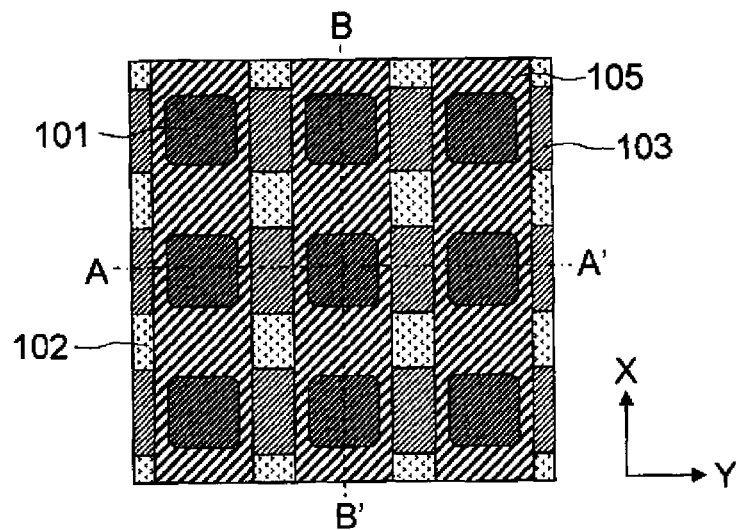
FIGS. 11A to 11C are process diagrams (forming gate electrodes 105) showing a manufacturing process of the memory cell MC according to the first embodiment.
Figure 11B:
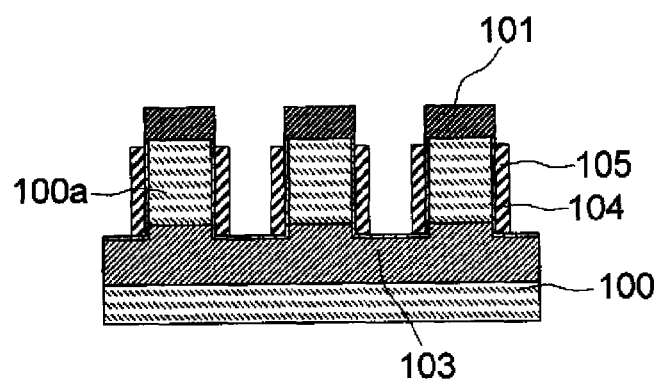
Figure 11C:
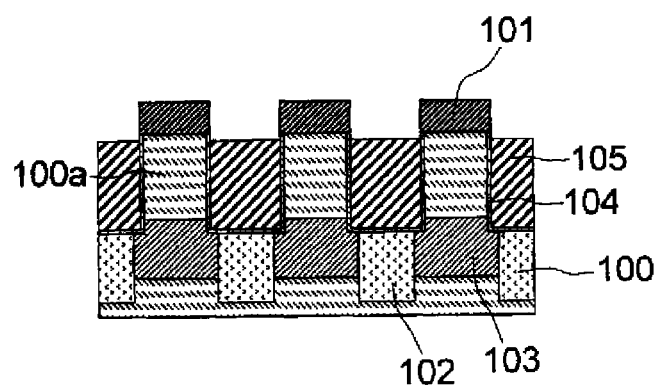

Next, as shown in FIGS. 11A to 11C, a thermal oxidation process is performed to form the gate insulation films 104 made of a silicon oxide film on side surfaces of the silicon pillars 100a. In the present invention, it is not essential to use a silicon oxide film for a material of the gate insulation films 104, and other insulation materials such as a silicon nitride film and a high-dielectric-constant film such as HfSiON can be used.

Next, a polycrystalline silicon film introduced with N-type impurities is deposited on the whole surface, thereby the polycrystalline silicon film is embedded between the silicon pillars 100a. the polycrystalline silicon film is etched back to expose an upper part of the mask nitride films 101. Further, the polycrystalline silicon film is patterned by using a mask pattern (not shown) extended to the X direction. As a result, the gate electrodes 105 extended to the X direction are formed. An interval between the gate electrodes 105 adjacent in the Y direction can be set to approximately 15 nm. A material of the gate electrodes 105 is not limited to polycrystalline silicon introduced with N-type impurities, and can be refractory metal.

Figure 12A:
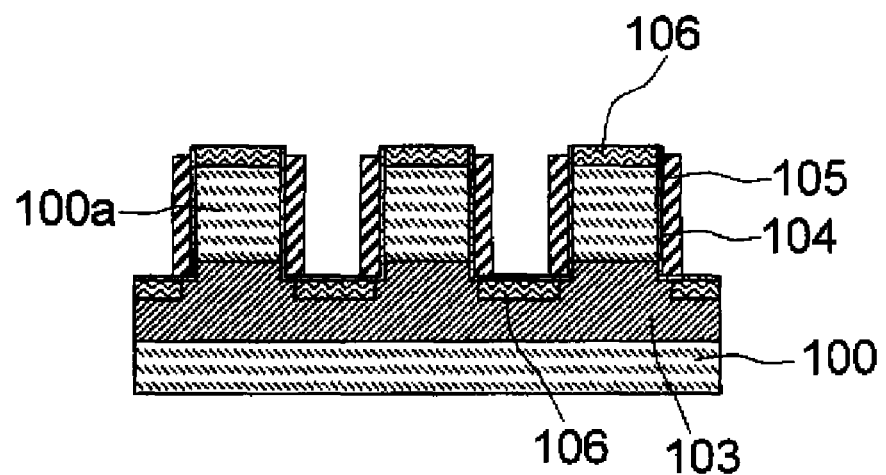
FIGS. 12A and 12B are process diagrams (forming N-type diffusion layer 106) showing a manufacturing process of the memory cell MC according to the first embodiment.
Figure 12B:
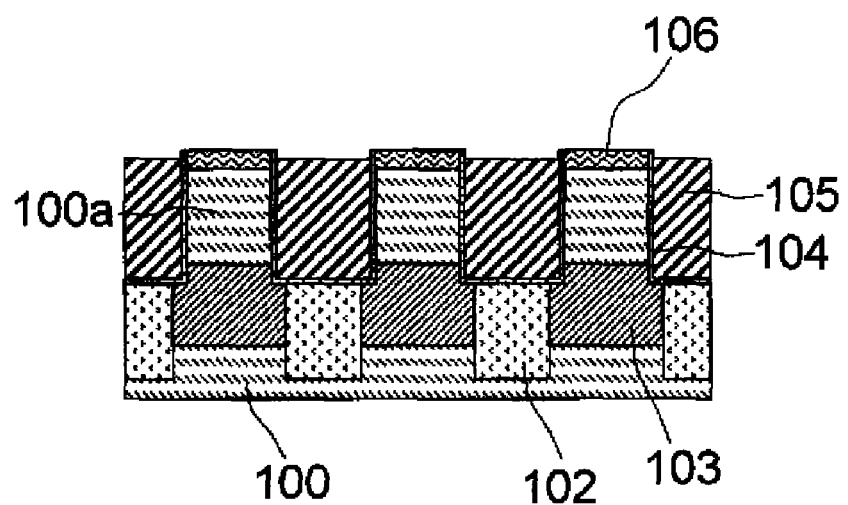

Next, the mask nitride films 101 are removed, and as shown in FIGS. 12A and 12B, N-type impurities such as phosphorus are ion implanted, and thereafter an activation heating process is performed, thereby forming the N-type diffusion layers 106 on the upper part of the silicon pillars 100a and on the surface of the semiconductor substrate 100 positioned between the silicon pillars 100a. When phosphorus is used for the impurity, a dose amount of approximately $2 \times 10^{15}$ atoms/cm$^2$ is sufficient. As a result, the N-type diffusion layers 103 and 106 are formed to become a source or drain at an upper part and a lower part of the silicon pillars 100a. FIG. 12A shows a cross section in the Y direction, and FIG. 12B shows a cross section in the X direction.

Figure 13:
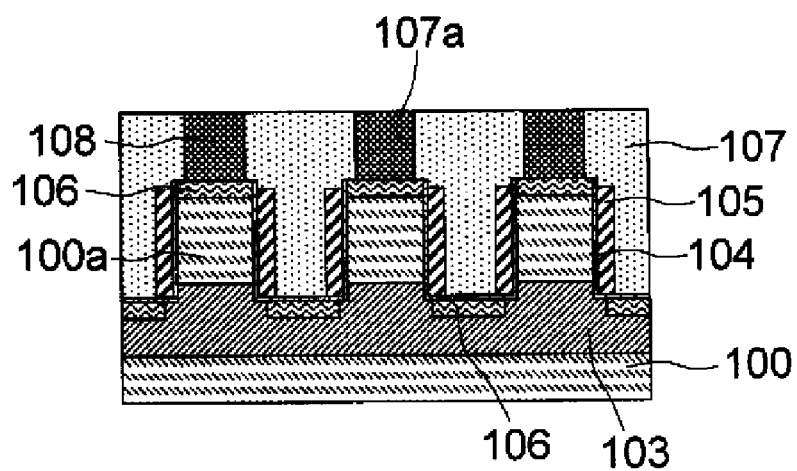
FIG. 13 is a process diagram (forming contact plugs 108) showing a manufacturing process of the memory cell MC according to the first embodiment.

Next, as shown in FIG. 13, the interlayer insulation film 107 is formed on the whole surface, and contact holes 107a are formed in the interlayer insulation film 107, thereby exposing the N-type diffusion layers 106. A titanium film, a titanium nitride film, and a tungsten film are sequentially formed on the whole surface including the inside of the contact holes 107a, and thereafter these conductive films on the interlayer insulation film 107 are removed by using a CMP method. As a result, the contact plugs 108 connected to the N-type diffusion layers are embedded in the contact holes 107a. An N-type doped silicon film can be used for a material of the contact plugs 108.

Figure 14:
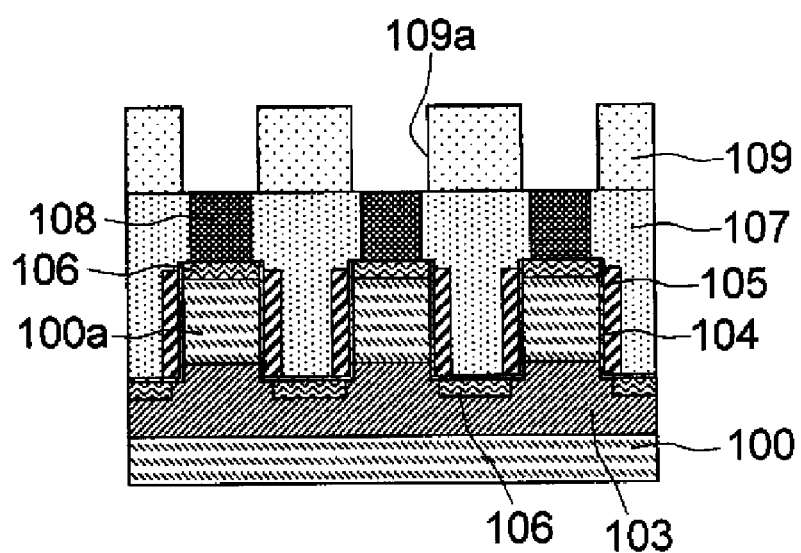
FIG. 14 is a process diagram (forming through-holes 109a) showing a manufacturing process of the memory cell MC according to the first embodiment.

Next, as shown in FIG. 14, the interlayer insulation film 109 is formed in a film thickness of approximately 40 nm on the interlayer insulation film 107. The through-holes 109a are formed in the interlayer insulation film 109, thereby exposing the contact plugs 108.

Figure 15:
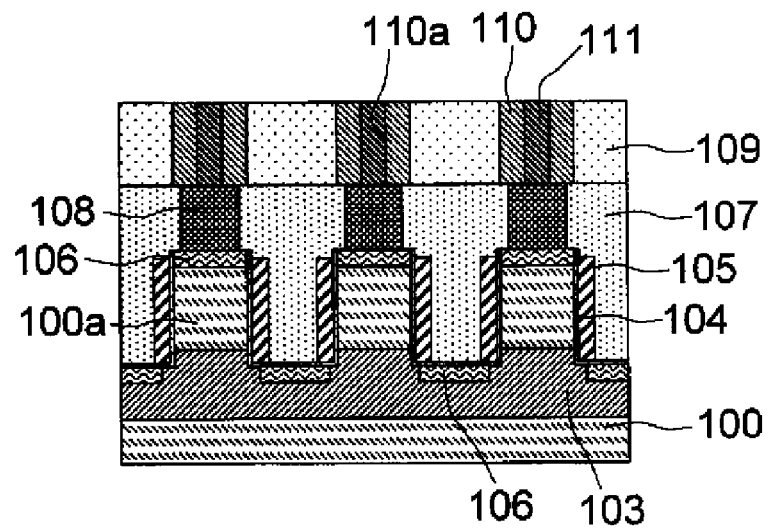
FIG. 15 is a process diagram (forming heater electrodes 111) showing a manufacturing process of the memory cell MC according to the first embodiment.

Next, an insulation film is formed on the whole surface, and this film is etched back to form the sidewall insulation films 110 that covers inner walls of the through-hole 109a, respectively, as shown in FIG. 15. A silicon nitride film and a silicon oxide film can be used for a material of the sidewall insulation films 110, and the film thickness can be approximately 15 nm. In this case, when an opening diameter of the through-holes 109a is 40 nm, a diameter of the cylindrical regions 110a surrounded by the sidewall insulation films 110 becomes 10 nm.

Next, a titanium nitride film is formed on the whole surface including the regions 110a surrounded by the sidewall insulation films 110, and this film is polished by the CMP method to remove the titanium nitride film on the interlayer insulation film 109. As a result, the heater electrodes 111 connected to the contact plugs 108 are embedded in the regions 110a, respectively. A material of the heater electrodes 111 is not limited to a titanium nitride film. Consequently, the heater electrodes 111 having a smaller diameter than that of the resolution limit of lithography can be formed.

Figure 16:
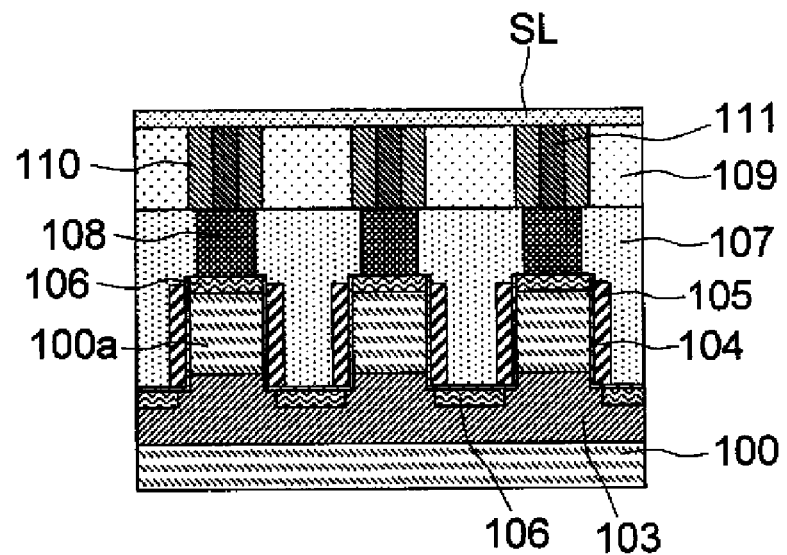
FIG. 16 is a process diagram (forming a superlattice laminate SL) showing a manufacturing process of the memory cell MC according to the first embodiment.

Next, as shown in FIG. 16, the superlattice laminate SL is laminated on the surfaces of the planarized interlayer insulation film 109. A configuration of the superlattice laminate SL is as explained with reference to FIG. 3, and the crystal layer 1 and the crystal layer 2 are alternately laminated. A film formation of the superlattice laminate SL can be performed by using a molecular-beam epitaxy device shown in FIG. 18.

Figure 18:
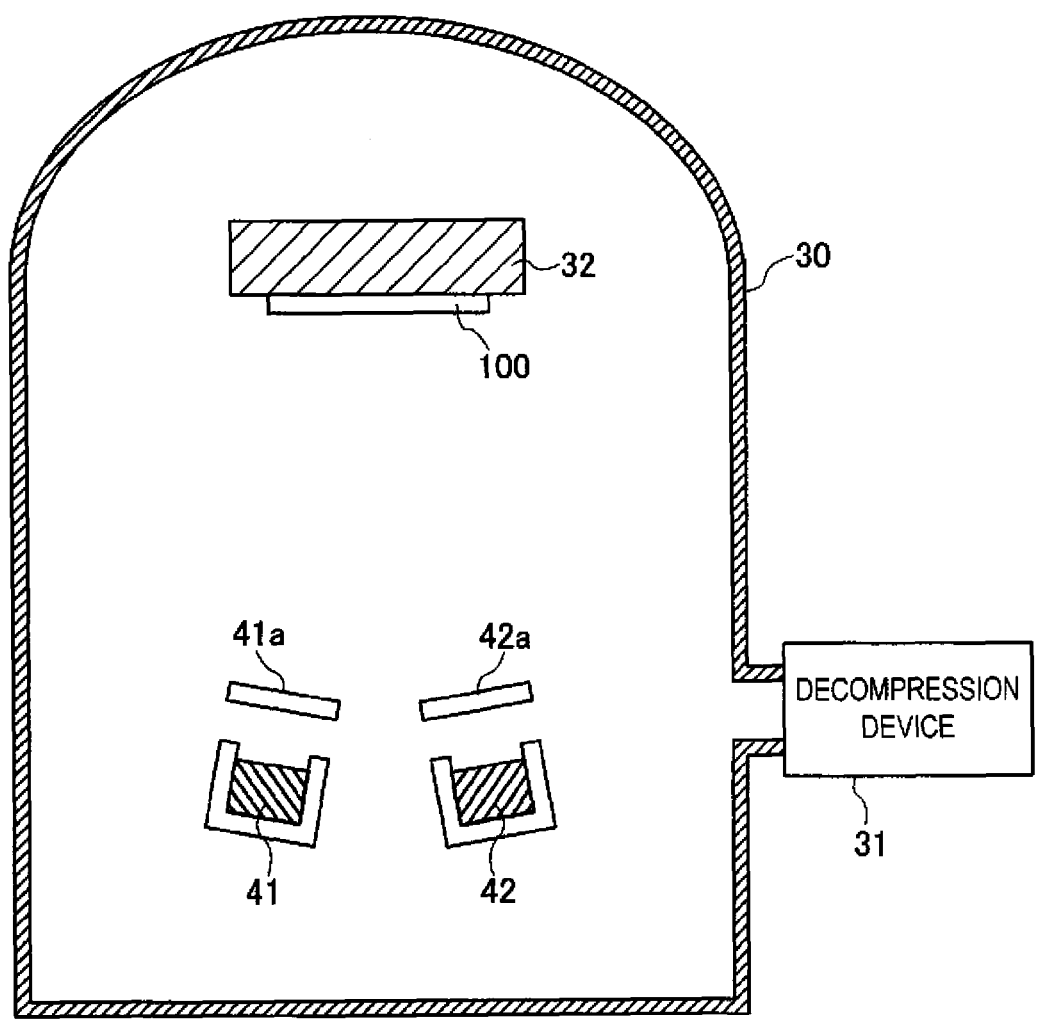
FIG. 18 is a schematic cross-sectional view showing a configuration of the molecular-beam epitaxy device.

FIG. 18 is a schematic cross-sectional view showing a configuration of the molecular-beam epitaxy device.

The molecular-beam epitaxy device shown in FIG. 18 includes a vacuum chamber 30, a decompression device 31 decompressing the inside of the vacuum chamber 30, a stage 32 provided within the vacuum chamber 30, and two sources 41 and 42. The source 41 is GeTe, and the source 42 is Sb$_2$Te$_3$. Shutters 41a and 42a are provided for the sources 41 and 42, respectively, thereby making it possible to individually select presence or absence of irradiation of a source compound. A distance between each of the sources 41 and 42 and the semiconductor substrate 100 is preferably equal to or larger than 100 mm. This is because when a distance between each of the sources 41 and 42 and the semiconductor substrate 100 is large, controllability of a lamination amount by irradiation time improves, and uniformity of a laminated film improves. Further, a thermal migration effect to an atom stable position on a substrate surface becomes large, and this becomes advantageous to crystallize each layer. This effect can be obtained to some extent by increasing a distance between each of the sources 41 and 42 and the semiconductor substrate 100 to equal to or larger than 100 mm, and can be obtained more sufficiently by increasing this distance to approximately 200 mm. However, when a distance between each of the sources 41 and 42 and the semiconductor substrate 100 becomes large, the device becomes large. Therefore, by taking this point into consideration, a distance between each of the sources 41 and 42 and the semiconductor substrate 100 is ideally 50 to 250 mm.

A film forming method of the superlattice laminate SL using the molecular-beam epitaxy device shown in FIG. 18 is as follows.

First, the semiconductor substrate 100 after the process shown in FIG. 15 is mounted on the stage 32, and thereafter the inside of the vacuum chamber 30 is decompressed to a predetermined degree of vacuum by using the decompression device 31. A temperature of the semiconductor substrate 100 is set preferably equal to or higher than 100° C. and equal to or lower than 400° C., and is more preferably at approximately 300° C. This is because $Sb_2Te_3$ is not crystallized and becomes in an amorphous state when the temperature is lower than 100° C., and a constituent element such as $Sb_2Te_3$ sublimates when the temperature exceeds 400° C. In this state, the shutter 42a is opened, and the shutter 41a is kept closed. Accordingly, $Sb_2Te_3$ of the source 42 is irradiated, thereby forming an $Sb_2Te_3$ compound on the interlayer insulation film 109. Orientation of a c-axis of the $Sb_2Te_3$ compound to a laminating direction is not sufficient immediately after a film is formed. However, each time when the film thickness increases, orientation intensity of the c-axis to the laminating direction is enhanced. When the film thickness becomes equal to or larger than 5 nm, the c-axis of a crystal is orientated to the laminating direction at least at a surface portion. As a result, film formation of the crystal layer 2 as a first layer is completed.

Next, the shutter 41a is opened, and the shutter 42a is closed. Accordingly, GeTe of the source 41 is irradiated to the crystal layer 2, thereby forming a GeTe compound. At this time, because the c-axis of a crystal is orientated to a laminating direction at least at a surface portion of the crystal layer 2 that becomes the underlaying layer, a film of the GeTe compound formed on the surface of the crystal layer 2 becomes a (111)-surface. When the GeTe compound is formed in a predetermined film thickness in this way, film formation of the crystal layer 1 as the first layer is completed. The crystal lattice of the crystal layer 1 is preferably only one layer. In this case, the film thickness becomes approximately 1.8 nm.

Next, the shutter 42a is opened, and the shutter 41a is closed. Accordingly, $Sb_2Te_3$ of the source 42 is irradiated to the crystal layer 1, thereby forming an $Sb_2Te_3$ compound. At this time, because a laminated surface of the crystal layer 1 that becomes the underlaying layer is (111)-orientated, a film of the c-axis of the $Sb_2Te_3$ compound formed on the surface of the laminated surface is orientated to the laminating direction. When the $Sb_2Te_3$ compound is formed in a predetermined film thickness in this way, film formation of the crystal layer 2 as a second layer is completed. The crystal lattice of the crystal layer 2 in the second layer afterward is preferably only one layer. In this case, the film thickness becomes approximately 1.8 nm.

Thereafter, a film formation of the crystal layer 1 and a film formation of the crystal layer 2 are performed alternately. As a result, the superlattice laminate SL having the crystal layer 1 and the crystal layer 2 alternately formed on the surfaces of the interlayer insulation film 109 is formed. A forming method of the superlattice laminate SL is not limited to a molecular-beam epitaxy method, and an ALD method or the like can be also used.

A film formation of the superlattice laminate SL is started from the crystal layer 2, and a film thickness of the crystal layer 2 that becomes the first layer is set larger than a film thickness of other crystal layers. This is for the purpose of setting the c-axis of the $Sb_2Te_3$ constituting the crystal layer 2 to be strongly orientated to the laminating direction. This setting is described in detail later.

Figure 17A:
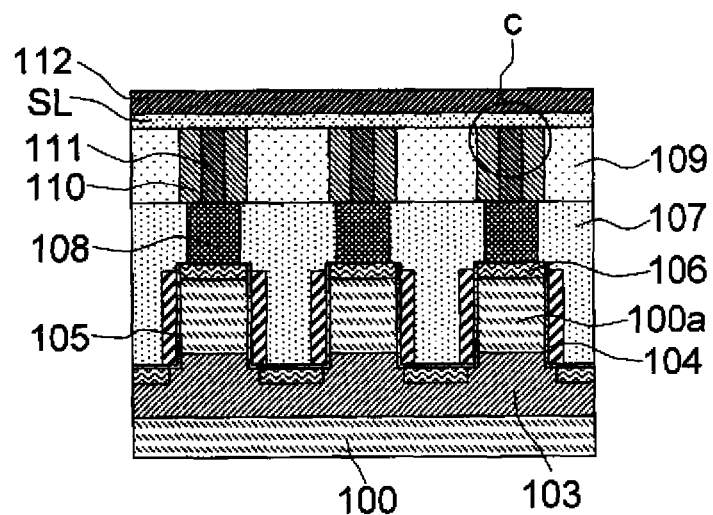
FIGS. 17A to 17C are process diagrams (forming upper electrodes 112) showing a manufacturing process of the memory cell MC according to the first embodiment.
Figure 17B:
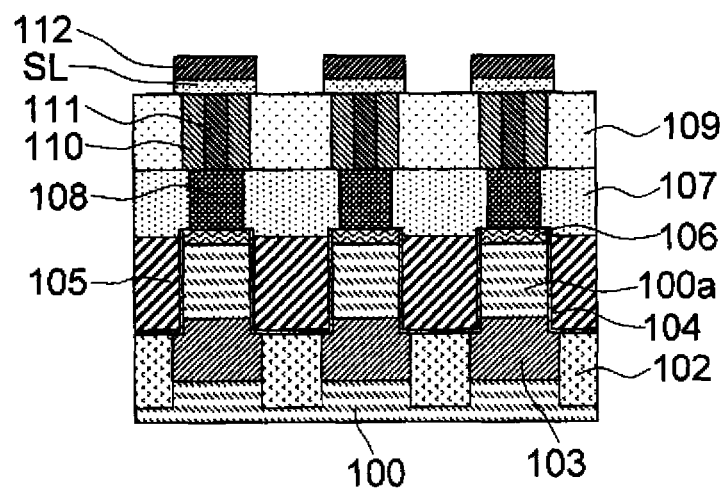

Next, as shown in FIGS. 17A and 17B, a titanium nitride film is formed on the surface of the superlattice laminate SL, and thereafter patterning is performed to form the upper electrodes 112 extended to the Y direction. The upper electrode 112 corresponds to the upper electrode 4 shown in FIG. 3. The upper electrodes 112 adjacent in the X direction can be set at a pitch of approximately 100 nm. The film thickness of the upper electrodes 112 can be 30 nm. A sputtering method can be used for a film formation. In this case, a film formation temperature can be suppressed to approximately 200° C. Although a CVD method and an ALD method can be used to form the upper electrodes 112, the upper electrodes 112 need to be formed at 400° C. or at a lower temperature to avoid damaging the superlattice laminate SL. FIG. 17A shows a cross section in the Y direction, and FIG. 17B shows a cross section in the X direction.

Figure 17C:
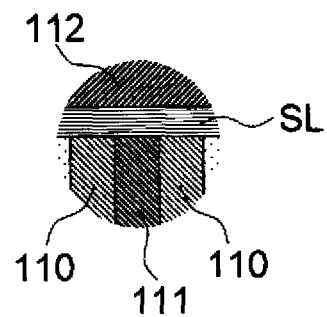

FIG. 17C is an enlarged cross-sectional view of a region C in FIG. 17A.

As shown in FIG. 17C, a lower surface as a lamination starting surface of the superlattice laminate SL is in contact with the heater electrode 111, and an upper surface as a lamination ending surface of the superlattice laminate SL is in contact with the upper electrode 112. With this arrangement, when a current is passed to the superlattice laminate SL via these electrodes, the current flows to a laminating direction of the superlattice laminate SL.

Thereafter, as shown in FIGS. 7A and 7B, the protection insulation film 113 made of a silicon nitride film is formed on the whole surface, and the interlayer insulation film 114 made of a silicon oxide film is formed on the whole surface, thereby completing the memory cell MC according to the first embodiment. The protection insulation film 113 functions to prevent degradation of the superlattice laminate SL by preventing entrance of oxygen into the superlattice laminate SL. After an end of the superlattice laminate SL is exposed by patterning, oxygen contained in a thermal process in an oxidizing atmosphere, and in an interlayer film as a silicon oxide film enters the superlattice laminate SL from, diffuses a lamination interface, and degrades performance of the superlattice laminate SL. A film containing a small amount of oxygen is preferable for the protection insulation film 113, and a dense film is suitable. It is preferable that a plasma CVD method is used to form the protection insulation film 113. As the material of the interlayer insulation film 114, a BPSG film, an SOD film or the like can be also used. In any case, after the superlattice laminate SL is formed, the process temperature needs to be 400° C. or lower.

Significance of forming the superlattice laminate SL starting from the crystal layer 2 and significance of setting the crystal layer 2 as the first layer in a larger thickness than that of other crystal layers are explained next.

The crystal layer 2 as the first layer has a function of (111)-orientating the laminated surface of the crystal layer 1 as a cubical crystal. The crystal layer 1 transits with the smallest energy when the laminated surface is (111)-orientated. Therefore, in order to increase a device characteristic of the memory cell MC including the superlattice laminate SL, the laminated surface of the crystal layer 1 as a cubical crystal needs to be (111)-orientated. However, even when a material of which a crystal structure transits, such as the GeTe compound described above, is deposited by using a gas-phase growing method such as the sputtering method, the molecular-beam epitaxy (MBE) method, the ALD method, or the CVD method, the (111)-surface does not become a laminated surface depending on a state of the underlaying layer. Formation of the superlattice laminate SL is started from the crystal layer 2, and the crystal layer 2 as the first layer is set in a larger thickness than that of other crystal layers in order to solve these problems.

That is, when the formation of the superlattice laminate SL is started from the crystal layer 2 and also when the crystal layer 2 as the first layer is set in a larger thickness than that of other crystal layers, the crystal layer 2 function as an orientation layer to the crystal layer 1, and the laminated surface of the crystal layer 1 becomes the (111)-surface.

Figure 19A:
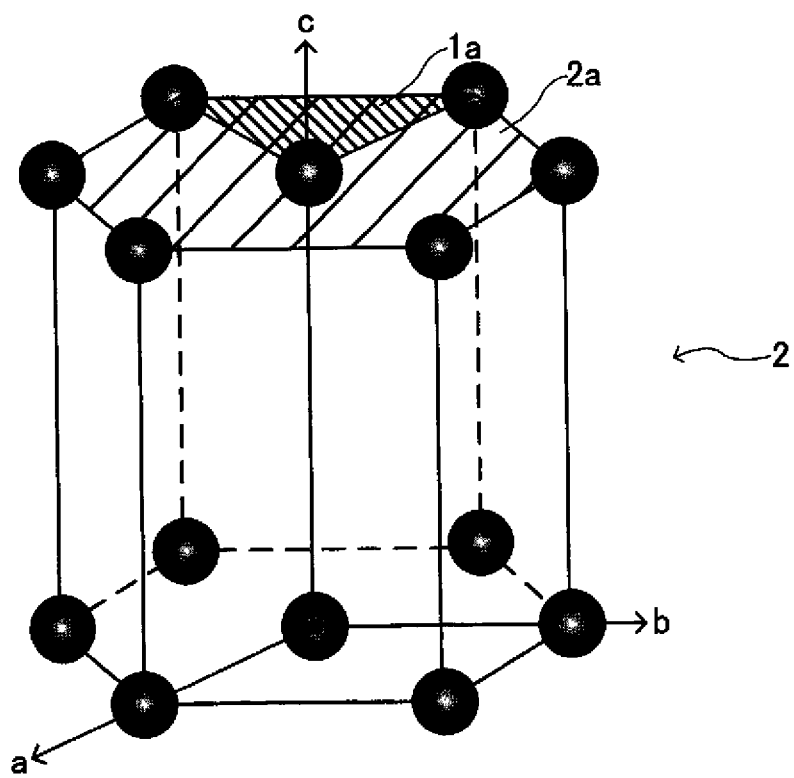
FIG. 19A shows the crystal layer 2 which is c-axis orientated.
Figure 19B:
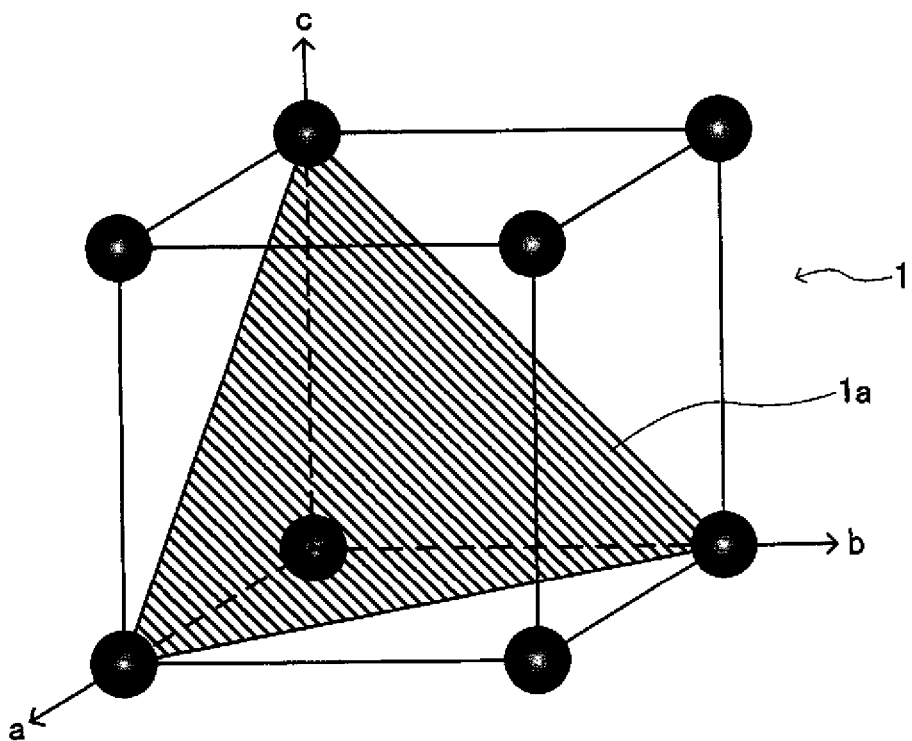
FIG. 19B shows the (111)-surface of the crystal layer 1.

FIG. 19A shows the crystal layer 2 which is c-axis orientated, and FIG. 19B shows the (111)-surface of the crystal layer 1.

As shown in FIG. 19A, when the crystal layer 2 ($Sb_2Te_3$) as a hexagonal crystal is c-axis orientated, a laminated surface 2a becomes hexagonal. Therefore, when the crystal layer 1 (GeTe) as an NaCl cubical crystal is deposited on a surface of the crystal layer 2 which is c-axis orientated, the (111)-surface shown in FIG. 19B becomes a laminated surface 1a. That is, because the (111)-surface of the cubical crystal is triangular as shown in FIG. 19B, this surface matches the laminated surface 2a of the crystal layer 2 which is c-axis orientated (see reference character 1a shown in FIG. 19A). Therefore, when the crystal layer 1 as a cubical crystal is deposited on the surface of the crystal layer 2 which is c-axis orientated, the (111)-surface becomes the laminated surface 1a. On the other hand, when this crystal layer 2 functioning as the orientation layer is not present, the crystal layer 1 is orientated to the (100)-surface, for example. In this case, many lattice disorders are formed in the superlattice laminate.

When an $Sb_2Te_3$ compound is deposited by using a gas-phase growing method such as the sputtering method, the molecular-beam epitaxy method, the ALD method, or the CVD method, the c-axis is orientated to the laminating direction. However, immediately after a film formation, the c-axis is not satisfactorily orientated to the laminating direction. Each time when the film thickness increases, orientation intensity of the c-axis to the laminating direction increases. Specifically, the film thickness of the crystal layer 2 as the first layer is preferably equal to or larger than 3 nm, and is most preferably equal to or larger than 5 nm. This is because when the film thickness of the crystal layer 2 as the first layer is smaller than 3 nm, orientation intensity of the crystal layer 2 to the c-axis becomes insufficient, and a function of (111)-orientating the laminated surface of the crystal layer 1 cannot be obtained sufficiently as a result. When the film thickness of the crystal layer 2 as the first layer is equal to or larger than 5 nm, orientation intensity of the crystal layer 2 to the c-axis becomes sufficient, and the laminated surface of the crystal layer 1 can be almost completely (111)-orientated as a result. From this viewpoint, the film thickness of the crystal layer 2 as the first layer does not need to be excessively large. Therefore, it is particularly preferable that the film thickness of the crystal layer 2 as the first layer is equal to or larger than 5 nm and equal to or smaller than 10 nm.

The crystal layer 2 as a second layer afterward is formed on the surface of the crystal layer 1 of which laminated surface is (111)-orientated. Therefore, the crystal layer is immediately c-axis orientated. Consequently, the crystal layer 1 as a second layer afterward can also have a laminated surface (111)-orientated.

In the present invention, it is not essential that a first layer of the superlattice laminate SL is the crystal layer 2 made of $Sb_2Te_3$.

A configuration of the memory cells MC according to a second embodiment of the present invention is explained next.

Figure 20A:
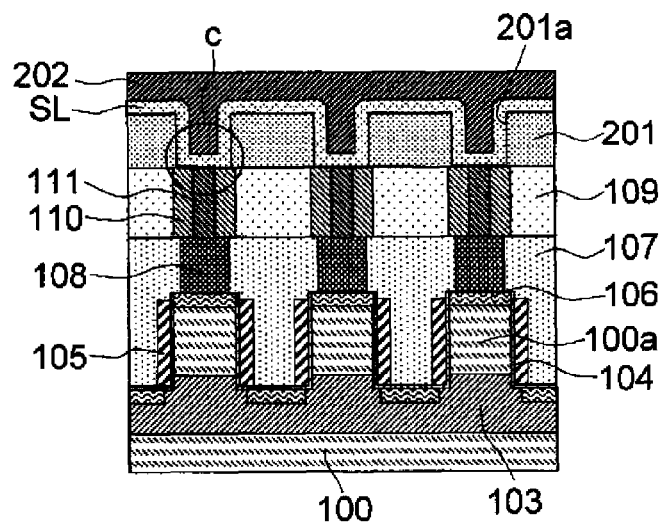
FIGS. 20A to 20C show a device configuration of the memory cells MC according to the second embodiment, where
Figure 20B:
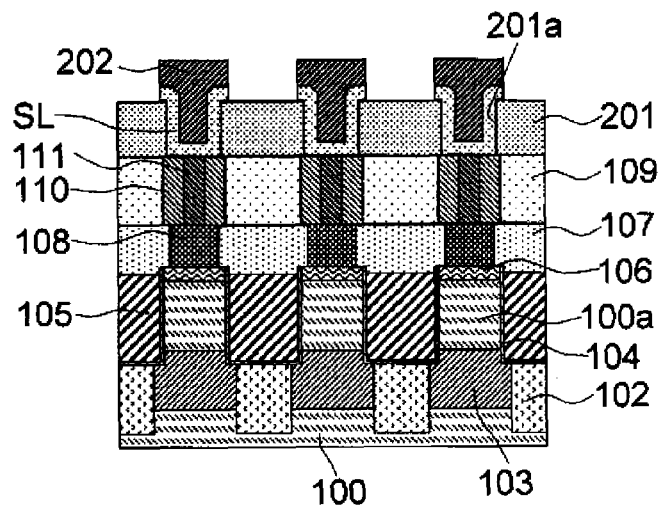
Figure 20C:
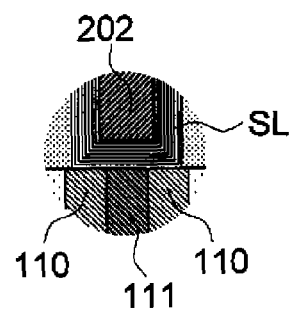

FIGS. 20A to 20C show a device configuration of the memory cells MC according to the second embodiment, where FIG. 20A is a schematic cross-sectional view along a bit line direction (a Y direction), FIG. 20B is a schematic cross-sectional view along a word line direction (an X direction), and FIG. 20C is an enlarged schematic cross-sectional view of a region C shown in FIG. 20A.

The memory cells MC shown in FIGS. 20A and 20B are different from the memory cells MC (according to the first embodiment) shown in FIGS. 7A and 7B, in a configuration of an upper part from the interlayer insulation film 109. Other features of the memory cells MC according to the second embodiment are identical to those of the first embodiment, and thus like elements are denoted by like reference numerals and redundant explanations thereof will be omitted.

In the second embodiment, interlayer insulation films 201 are provided on the interlayer insulation film 109, and a parts of the superlattice laminate SL and a part of upper electrodes 202 are embedded in a through-hole 201a provided in the interlayer insulation films 201. More specifically, a laminated surface of each of the superlattice laminate SL is provided along a bottom surface and an inner wall of the through-hole 201a. Further, an upper electrode 202 is provided within a region surrounded by the superlattice laminate SL. The superlattice laminate SL and the upper electrode 202 are extended to the Y direction.

According to the second embodiment, laminated surfaces of the superlattice laminate SL are provided along the bottom surface and the inner wall of the through-hole 201a. A current density can be increased and a phase change region can be decreased by further decreasing an opposed region of the heater electrode 111 and the upper electrode 202, and by limiting a current path in this region. Therefore, rewriting can be performed at a high speed by using a smaller amount of current. When the superlattice laminates SL are patterned by dry etching, an exposed portion is sometimes damaged. However, in the present configuration, an etching region to isolate the upper electrode 202 and the superlattice laminate SL from other cells is distantly-positioned from the phase change region by a height of the through-hole 201a. Therefore, this has an advantage in that the exposed portion is not easily influenced by the etching.

A manufacturing process of the memory cells MC according to the second embodiment is as follows.

Figure 21:
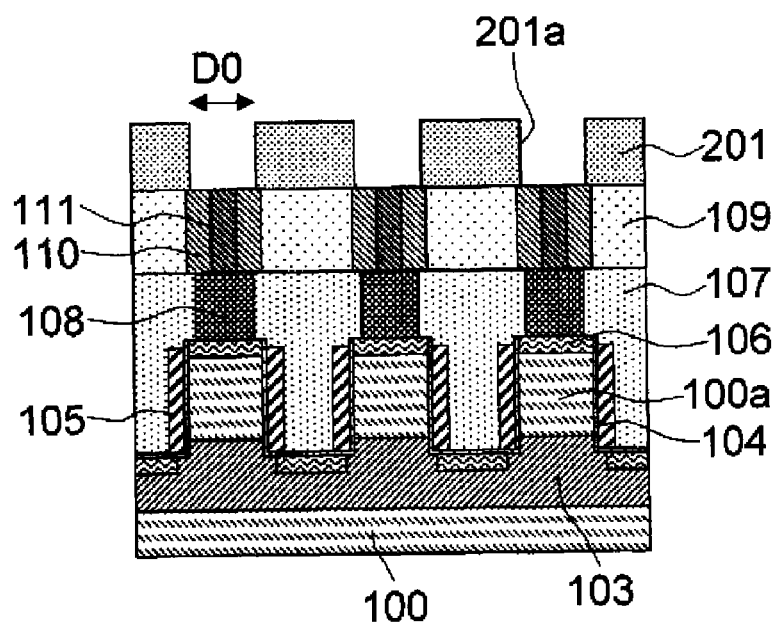
FIG. 21 is a process diagram (forming through-holes 201a) showing a manufacturing process of the memory cell MC according to the second embodiment.

First, after the processes shown in FIGS. 8 to 15 are performed, as shown in FIG. 21, the interlayer insulation films 201 made of a silicon nitride film are formed, and patterning is performed to form the through-holes 201a, thereby exposing upper surfaces of the heater electrodes 111. The interlayer insulation film 201 has a film thickness of approximately 40 nm, and the through-holes 201a have a diameter D0 of approximately 30 nm.

Figure 22:
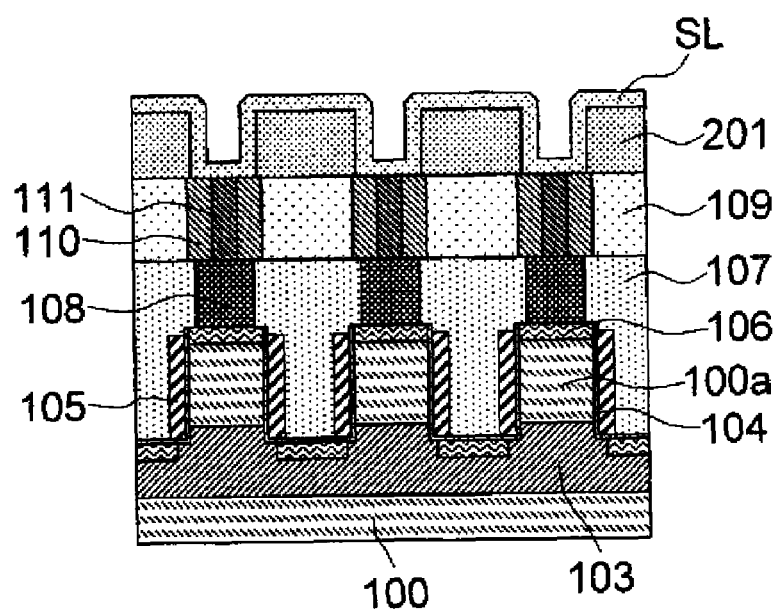
FIG. 22 is a process diagram (forming a superlattice laminate SL) showing a manufacturing process of the memory cell MC according to the second embodiment.

Next, as shown in FIG. 22, the superlattice laminate SL is formed on the whole surface including the inside of the through-holes 201a. As a result, the superlattice laminate SL is laminated along the bottom surface and the inner wall of the through-holes 201a. However, in the second embodiment, the film thickness of the superlattice laminate SL is controlled such that the through-holes 201a are not completely embedded in the superlattice laminate SL. The film thickness of the superlattice laminate SL is set approximately 8 nm. In the second embodiment, the superlattice laminate SL is preferably formed by the ALD method. The basic film forming method is as explained in the first embodiment, and it is preferable that the film formation is started from the crystal layer 2, and that the film thickness of the crystal layer 2 as the first layer is larger than that of other crystal layers.

As shown in FIGS. 20A and 20B, a titanium nitride film is formed on the surface of the superlattice laminate SL, and patterning is performed, thereby forming the upper electrodes 202 extended to the Y direction. The upper electrodes 202 have a film thickness of 30 nm. A film formation can be performed by the ALD method. Thereafter, although not shown, a protection insulation film made of a silicon nitride film is formed on the whole surface. Thereafter, an interlayer insulation film made of a silicon oxide film is formed, thereby completing the memory cells MC according to the second embodiment.

A configuration of the memory cells MC according to a third embodiment of the present invention is explained next.

Figure 23A:
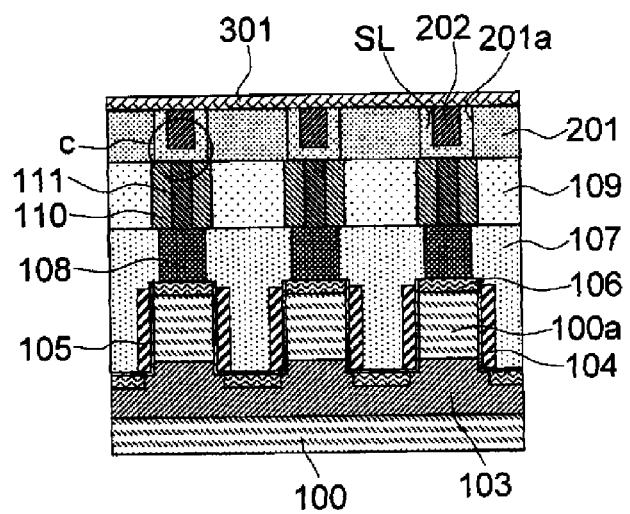
FIGS. 23A to 23C show a device configuration of the memory cells MC according to the third embodiment, where
Figure 23B:
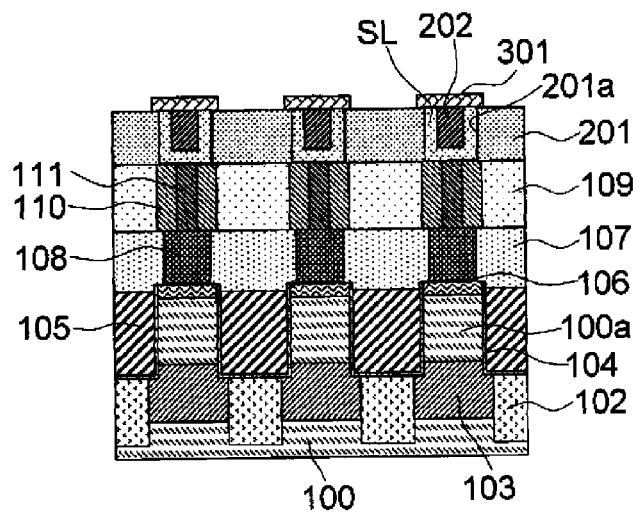
Figure 23C:
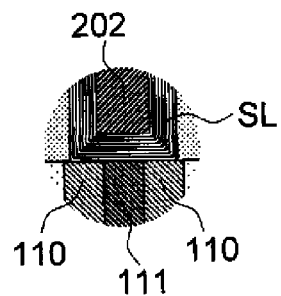

FIGS. 23A to 23C show a device configuration of the memory cells MC according to the third embodiment, where FIG. 23A is a schematic cross-sectional view along a bit line direction (the Y direction), FIG. 23B is a schematic cross-sectional view along a word line direction (the X direction), and FIG. 23C is an enlarged schematic cross-sectional view of a region C shown in FIG. 23A.

The memory cells MC shown in FIGS. 23A and 23B are different from the memory cells MC (according to the second embodiment) shown in FIGS. 20A and 20B, in a configuration of an upper part from the interlayer insulation films 201. Other features of the memory cells MC according to the third embodiment are identical to those of the second embodiment, and thus like elements are denoted by like reference numerals and redundant explanations thereof will be omitted.

In the third embodiment, upper surfaces of the interlayer insulation film 201 is planarized, and second upper electrodes 301 (the bit lines BL) are provided on the planarized interlayer insulation film 201. The second upper electrodes 301 are in contact with the superlattice laminates SL and the upper electrodes 202 embedded in the through-holes 201a, and are extended to the Y direction. In a similar manner to that of the second embodiment, a current density can be increased and a phase change region can be decreased by limiting the current path. Therefore, rewriting can be performed at a high speed by using a smaller amount of current. In the third embodiment, the upper electrodes 202 and the superlattice laminates SL are isolated by the CMP method. Therefore, in comparison with isolation by etching, removal of materials generated by the etching is not required. Further, because the superlattice laminates SL are covered by the second upper electrodes 301 and because a lamination cross section (a surface in a laminating direction) is not exposed, a protection insulation film to prevent degradation of the superlattice laminates SL can be omitted.

A manufacturing process of the memory cells MC according to the third embodiment is as follows.

Figure 24:
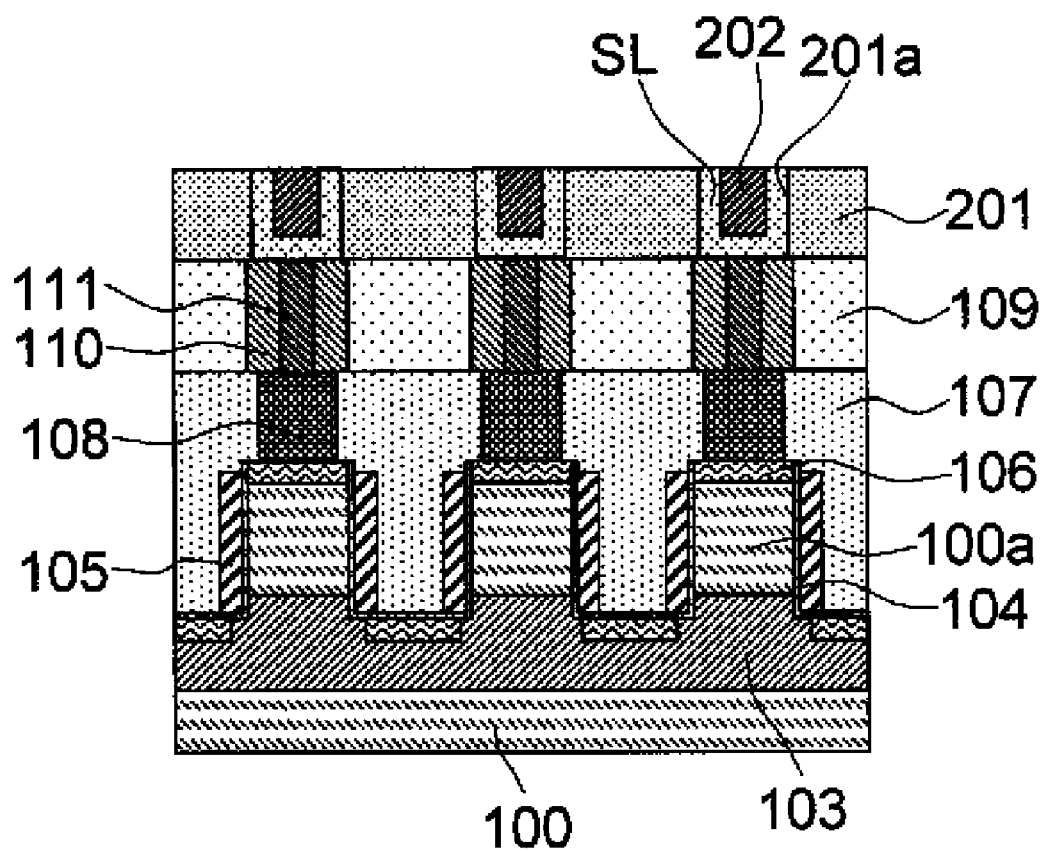
FIG. 24 is a process diagram (polishing the superlattice laminate SL and upper electrodes 202) showing a manufacturing process of the memory cell MC according to the third embodiment.

First, the processes shown in FIGS. 8 to 15 and FIGS. 21 and 22 are performed. Thereafter, as shown in FIG. 24, a titanium nitride film is formed, and this film is polished by the CMP method to expose upper surfaces of the interlayer insulation films 201. With this arrangement, the superlattice laminates SL and the upper electrodes 202 are embedded in the through-holes 201a. Next, a titanium nitride film is formed by approximately 30 nm on the planarized interlayer insulation films 201, and the film is patterned, thereby forming the second upper electrodes 301 extended to the Y direction. The memory cells MC according to the third embodiments are thus completed.

A configuration of the memory cells MC according to a fourth embodiment of the present invention is explained next.

Figure 25A:
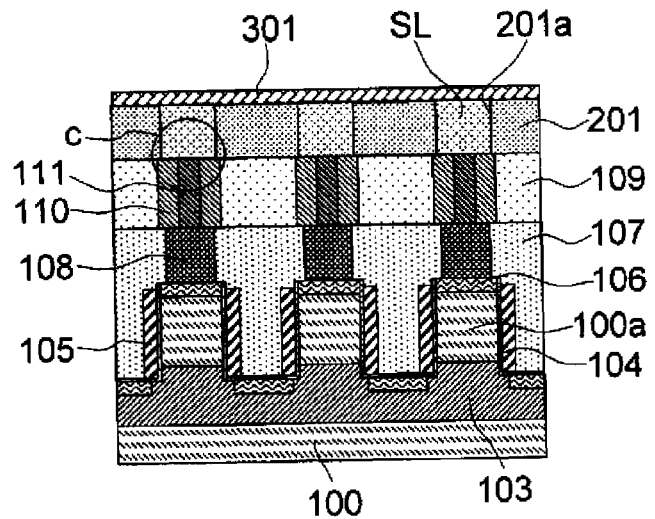
FIGS. 25A to 25C show a device configuration of the memory cells MC according to the fourth embodiment, where
Figure 25B:
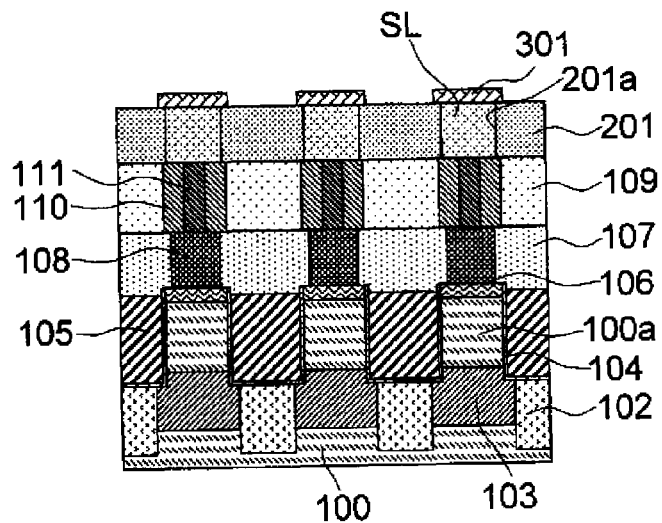
Figure 25C:
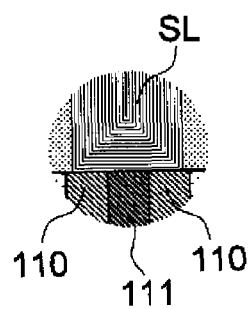

FIGS. 25A to 25C show a device configuration of the memory cells MC according to the fourth embodiment, where FIG. 25A is a schematic cross-sectional view along a bit line direction (the Y direction), FIG. 25B is a schematic cross-sectional view along a word line direction (the X direction), and FIG. 25C is an enlarged schematic cross-sectional view of a region C shown in FIG. 25A.

The memory cells MC shown in FIGS. 25A and 25B are different from the memory cells MC (according to the third embodiment) shown in FIGS. 23A and 23B, in a configuration of an internal part of the through-hole 201a. Other features of the memory cells MC according to the fourth embodiment are identical to those of the third embodiment, and thus like elements are denoted by like reference numerals and redundant explanations thereof will be omitted.

In the fourth embodiment, the through-holes 201a provided in the interlayer insulation films 201 are embedded with the superlattice laminates SL. That is, upper electrodes are not present in the through-holes 201a. In the fourth embodiment, the superlattice laminates SL are embedded in the through-holes 201a, and their laminated surfaces are provided along the bottom surfaces and the inner walls of the through-holes 201a. When a current is passed between the heater electrode 111 and the upper electrode 301, the current flows perpendicularly to a laminated surface of the superlattice laminate SL in only a region of the laminated surface of the superlattice laminate SL near the bottom surface of the through-hole 201a, because this laminated surface is in a horizontal direction. The current flows in parallel to the laminated surface in other regions of the superlattice laminate SL. When a current flows perpendicularly to the laminated surface, an energy is efficiently used for a phase change because the current flows in a direction crossing a lamination interface. On the other hand, when a current flows in parallel to the laminated surface, a current component crossing the lamination interface is very small because the current flows in a relatively low-resistance layer, and the energy does not contribute to a phase change. As a result, a phase change region is limited to near the bottom surface of the through-hole 201a. A phase change can be generated at a high speed at a low current because a current density is increased by limiting a current path between the heater electrode 111 and the upper electrode 301 to the inside of the through-hole 201a and because a phase change region is limited to near the bottom surface of the through-hole 201a. Because the upper electrode does not need to be formed within the through-hole 201a, the electrode can be formed in a simpler method. By separating the upper electrode 301 from the phase change region, heat diffusion from the phase change region of the superlattice laminate SL can be prevented.

A manufacturing process of the memory cells MC according to the fourth embodiment is as follows.

Figure 26:
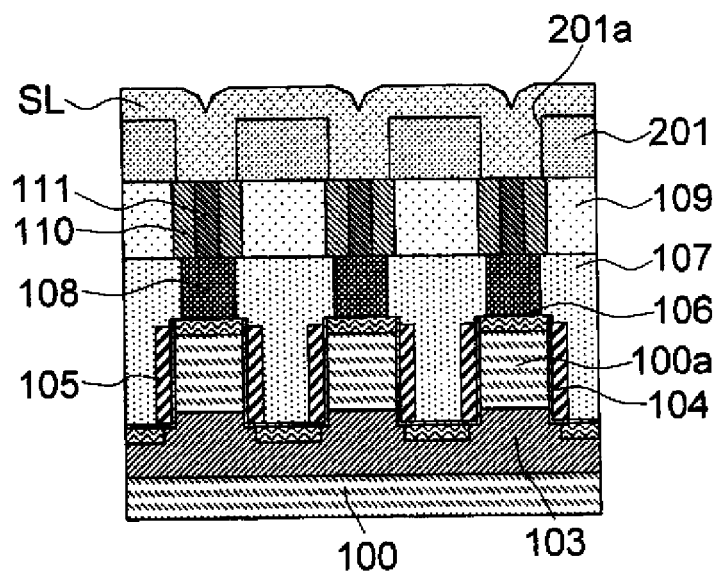
FIG. 26 is a process diagram (forming a superlattice laminate SL) showing a manufacturing process of the memory cell MC according to the fourth embodiment.

First, the processes shown in FIGS. 8 to 15 and FIG. 22 are performed. Next, as shown in FIG. 26, the superlattice laminate SL is formed on the whole surface including the inside of the through-holes 201a. To completely embed the through-holes 201a with the superlattice laminated SL, it suffices that the film thickness of the superlattice laminate SL is set approximately 30 nm.

Figure 27:
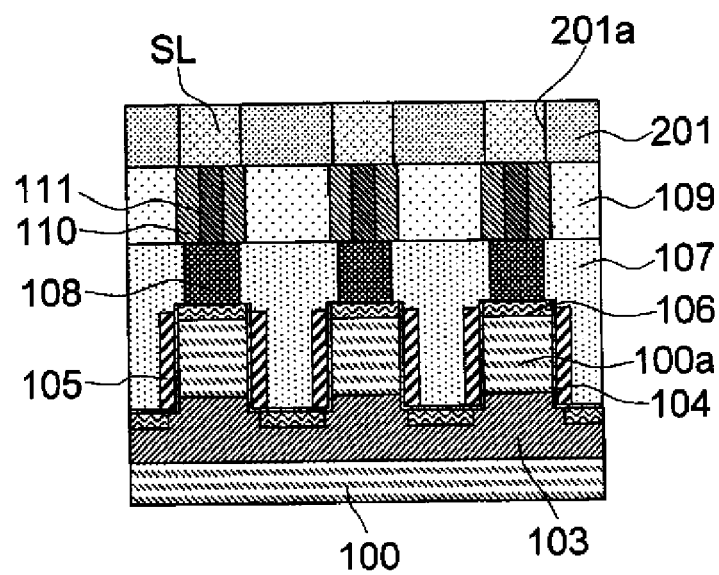
FIG. 27 is a process diagram (polishing the superlattice laminate SL) showing a manufacturing process of the memory cell MC according to the fourth embodiment.

Next, the superlattice laminate SL is polished by the CMP method to expose upper surfaces of the interlayer insulation films 201 as shown in FIG. 27. Consequently, the superlattice laminates SL embedded in the through-holes 201a are isolated for each of the memory cells MC. Next, a titanium nitride film is formed in approximately 30 nm on the planarized interlayer insulation films 201, thereby forming the upper electrodes 301 extended to the Y direction. The memory cells MC according to the fourth embodiment are thus completed.

A configuration of the memory cells MC according to a fifth embodiment of the present invention is explained next.

Figure 28A:
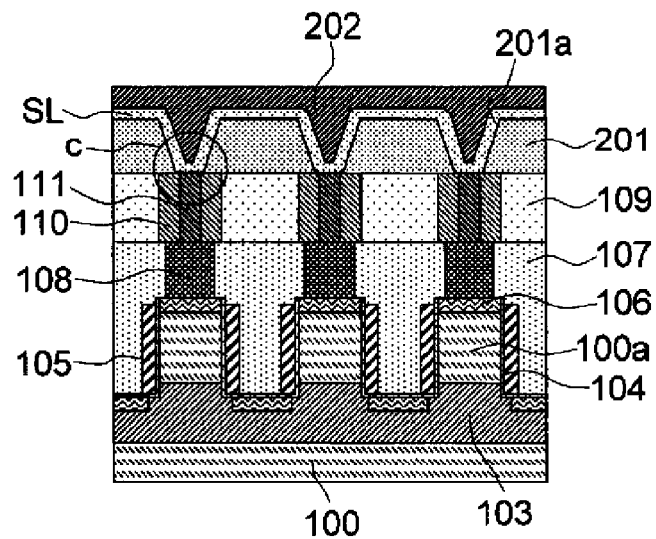
FIGS. 28A to 28C show a device configuration of the memory cells MC according to the fifth embodiment, where
Figure 28B:
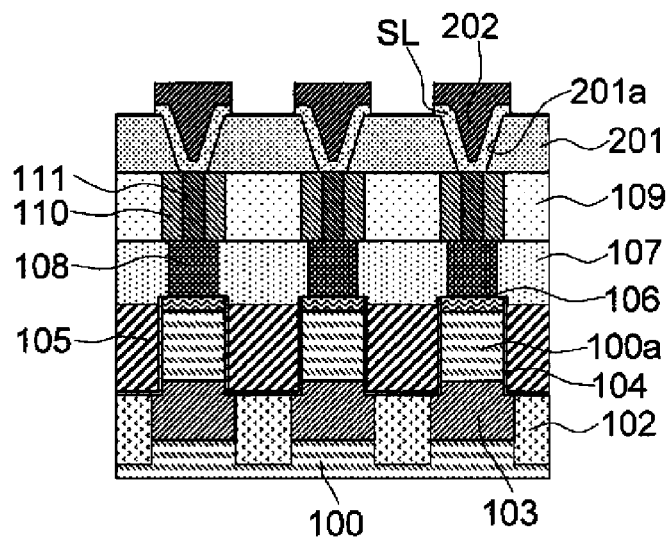
Figure 28C:
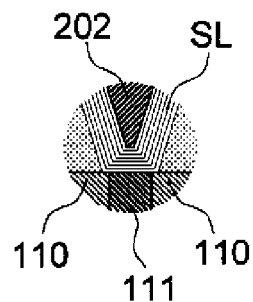

FIGS. 28A to 28C show a device configuration of the memory cells MC according to the fifth embodiment, where FIG. 28A is a schematic cross-sectional view along a bit line direction (the Y direction), FIG. 28B is a schematic cross-sectional view along a word line direction (the X direction), and FIG. 28C is an enlarged schematic cross-sectional view of a region C shown in FIG. 28A.

The memory cells MC shown in FIGS. 28A and 28B are different from the memory cells MC (according to the second embodiment) shown in FIGS. 20A and 20B, in that the through-holes 201a are tapered. Other features of the memory cells MC according to the fifth embodiment are identical to those of the second embodiment, and thus like elements are denoted by like reference numerals and redundant explanations thereof will be omitted.

In the fifth embodiment, the through-holes 201 are tapered such that internal diameters of the through-holes 201a become smaller toward the heater electrodes 111. Because the superlattice laminates SL are also formed along the inner walls of the tapered through-hole 201a, laminated surfaces of the superlattice laminates SL are inclined to the main surface of the semiconductor substrate 100. However, the laminated surfaces become substantially parallel to the main surface of the semiconductor substrate 100 at portions where the superlattice laminates SL are formed on the bottom of the through-holes 201a. According to the fifth embodiment, the upper electrodes 202 have projections to a direction of the heater electrodes 111, and have apical ends, respectively. When a current is passed between the heater electrode 111 and the upper electrode 202, the current is concentrated to the apical end of the upper electrode 202. Therefore, a current density can be remarkably increased, and a phase change region can be limited to near the apical ends of the upper electrodes 202. An energy is efficiently given to the superlattice laminates SL, and this contributes to operations at a high speed and a low current.

A manufacturing process of the memory cells MC according to the fifth embodiment is as follows.

Figure 29:
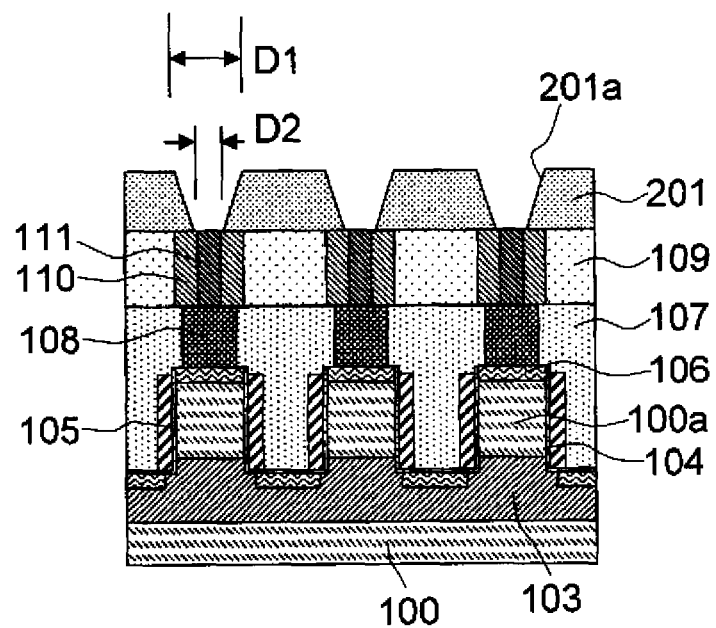
FIG. 29 is a process diagram (forming through holes 201a) showing a manufacturing process of the memory cell MC according to the fifth embodiment.

First, the processes shown in FIGS. 8 to 15 are performed. As shown in FIG. 29, the interlayer insulation films 201 are formed, and patterning is performed, thereby forming the tapered through-holes 201a. It suffices that the tapered through-holes have a top diameter D1 of approximately 40 nm, and have a bottom diameter D2 of approximately 20 nm. To form the through-holes 201a in a tapered shape, it suffices that isotropic etching such as wet etching is performed. The apical ends of the upper electrodes 202 can be obtained by setting small diameters to the through-holes 201a and by rounding an upper part of the through-holes 201a by, for example, providing a sidewall on the inner wall of the through-holes 201a.

Figure 30:
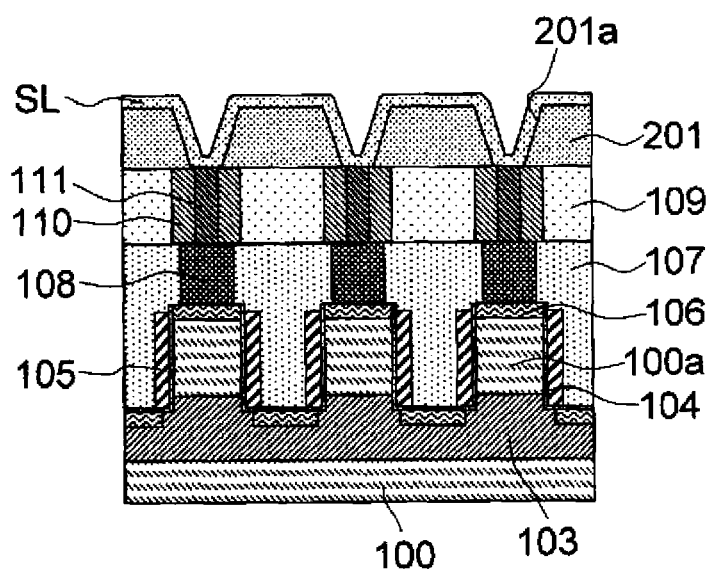
FIG. 30 is a process diagram (forming a superlattice laminate SL) showing a manufacturing process of the memory cell MC according to the fifth embodiment.

Next, as shown in FIG. 30, the superlattice laminate SL is formed on the whole surface including the inside of the through-holes 201a. With this arrangement, the superlattice laminate SL is laminated along the bottom surfaces and the inner walls of the through-holes 201a. In the fifth embodiment, the film thickness of the superlattice laminate SL is controlled such that the through-holes 201a are not completely embedded with the superlattice laminate SL. The superlattice laminate SL has a film thickness of approximately 7 nm.

As shown in FIGS. 28A and 28B, a titanium nitride film is formed on the surface of the superlattice laminate SL, and patterning is performed, thereby forming the upper electrodes 202 extended to the Y direction. The upper electrodes 202 have a film thickness of 30 nm. The ALD method can be used to form this film. Thereafter, although not shown, a protection insulation film made of a silicon nitride film is formed on the whole surface, and an interlayer insulation film made of a silicon oxide film is formed on the whole surface. The memory cells MC according to the fifth embodiment are thus completed.

A configuration of the memory cells MC according to a sixth embodiment of the present invention is explained next.

Figure 31A:
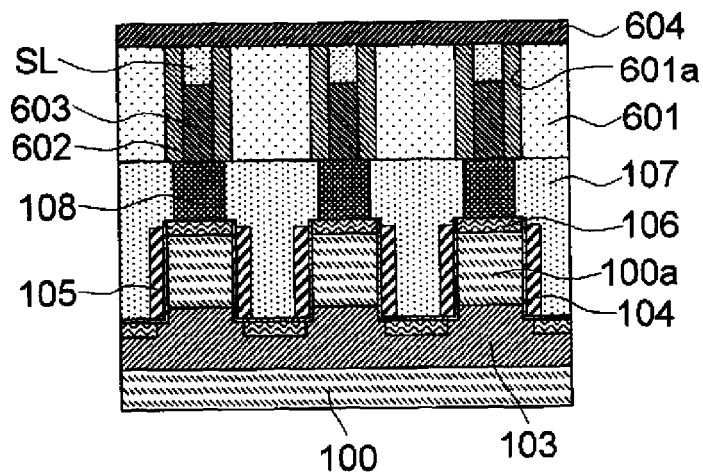
FIGS. 31A to 31C show a device configuration of the memory cells MC according to the sixth embodiment, where
Figure 31B:
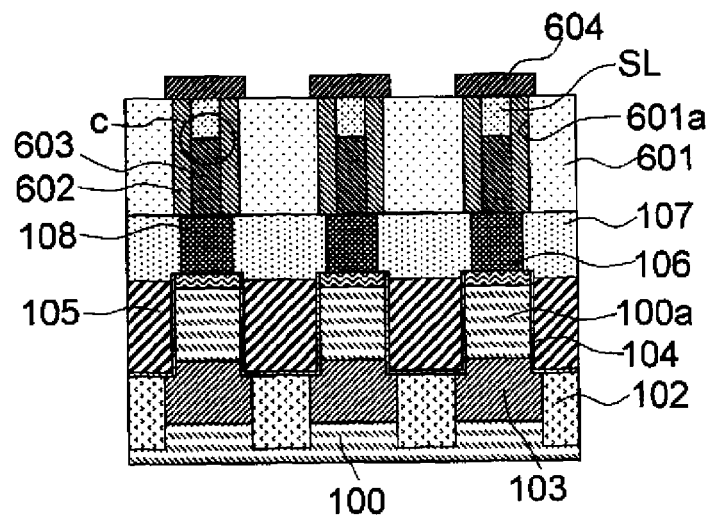
Figure 31C:

FIGS. 31A to 31C show a device configuration of the memory cells MC according to the sixth embodiment, where FIG. 31A is a schematic cross-sectional view along a bit line direction (the Y direction), FIG. 31B is a schematic cross-sectional view along a word line direction (the X direction), and FIG. 31C is an enlarged schematic cross-sectional view of a region C shown in FIG. 31B.

The memory cells MC shown in FIGS. 31A and 31B are different from the memory cells MC (according to the first embodiment) shown in FIGS. 7A and 7B, in a configuration of an upper part from the interlayer insulation film 107. Other features of the memory cells MC according to the sixth embodiment are identical to those of the first embodiment, and thus like elements are denoted by like reference numerals and redundant explanations thereof will be omitted.

In the sixth embodiment, the interlayer insulation film 601 is provided on the interlayer insulation film 107, and inner walls of through-holes 601a provided in the interlayer insulation films 601 are covered by sidewall insulation films 602. Lower electrodes 603 and the superlattice laminates SL are embedded in cylindrical regions surrounded by the sidewall insulation films 602. Specifically, the lower electrodes 603 are embedded in lower parts of the cylindrical regions, and the superlattice laminates SL are embedded in an upper part of the cylindrical regions. A laminated surface is substantially parallel to the main surface of the semiconductor substrate 100 at portions formed on bottoms of the cylindrical regions of the superlattice laminates SL.

Upper surfaces of the interlayer insulation film 601 are planarized, and upper electrodes 604 extended to the Y direction are provided on the surfaces of the interlayer insulation film 601. According to the sixth embodiment, the lower electrodes 603 and the superlattice laminates SL are embedded in thin cylindrical regions. Therefore, a phase change can be generated at a high speed and a low current by increasing a current density by limiting a current path between the lower electrodes 603 and the upper electrodes 604 to a thin cylindrical region and by limiting a phase change region to near a contact surface between the lower electrodes 603 and the superlattice laminate SL in the thin cylindrical region. Because the superlattice laminates SL are processed by the CMP method, removal of materials generated by an etching process is not required. Further, because the superlattice laminates SL are covered by the upper electrodes 604 and because a lamination cross section (a surface in a laminating direction) is not exposed, a protection insulation film to prevent degradation of the superlattice laminates SL can be omitted.

A manufacturing process of the memory cells MC according to the sixth embodiment is as follows.

Figure 32:
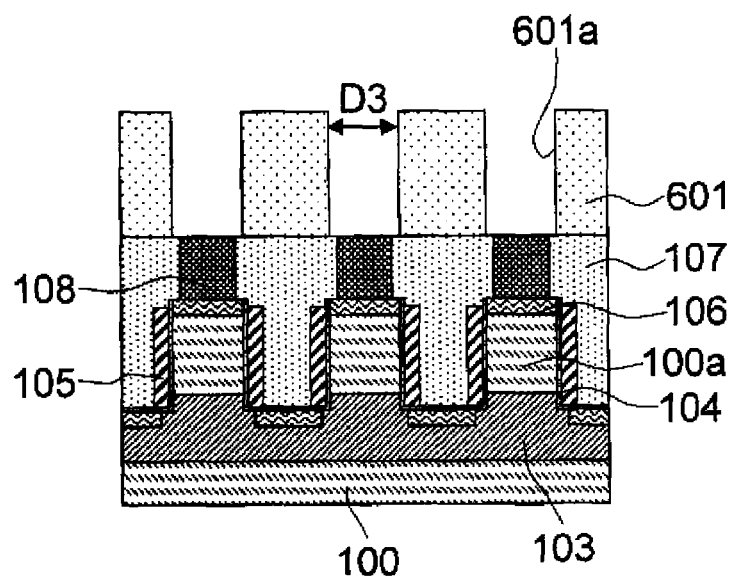
FIG. 32 is a process diagram (forming through holes 601a) showing a manufacturing process of the memory cell MC according to the sixth embodiment.

First, the processes shown in FIGS. 8 to 13 are performed. Thereafter, as shown in FIG. 32, the interlayer insulation film 601 is formed in a thickness of approximately 70 nm. Further, patterning is performed to form the through-holes 601a, thereby exposing upper surfaces of the contact plugs 108. The through-holes 601a have a diameter D3 of approximately 40 nm.

Figure 33:
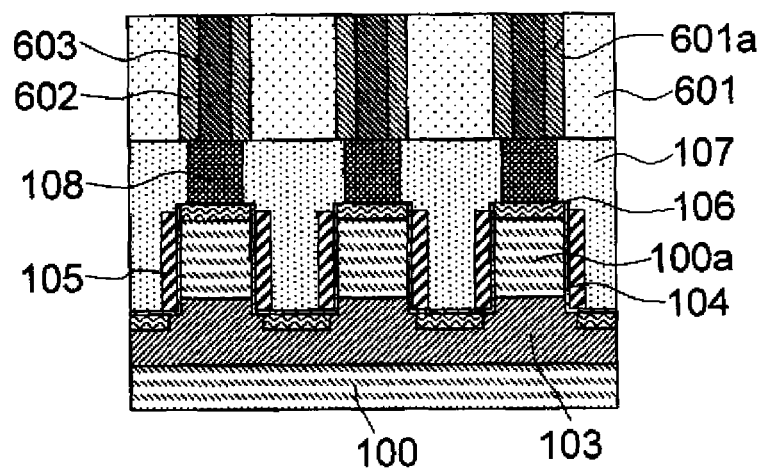
FIG. 33 is a process diagram (forming lower electrodes 603) showing a manufacturing process of the memory cell MC according to the sixth embodiment.

Next, an insulation film is formed on the whole surface, and this film is etched back, thereby forming the sidewall insulation films 602 that cover the inner walls of the through-holes 601a as shown in FIG. 33. The sidewall insulation films 602 have a film thickness of approximately nm. In this case, when an opening diameter of the through-holes 601a is 40 nm, each diameter of cylindrical regions surrounded by the sidewall insulation films 602 becomes 20 nm.

Next, a titanium nitride film is formed on the whole surface including the cylindrical regions surrounded by the sidewall insulation films 602, and the titanium nitride film is polished by the CMP method to remove the titanium nitride film on the interlayer insulation film 107. With this arrangement, the heater electrodes 603 connected to the contact plugs 108 are embedded in the cylindrical regions. Consequently, the heater electrodes 603 having a smaller diameter than that of a resolution margin of lithography can be formed.

Figure 34:
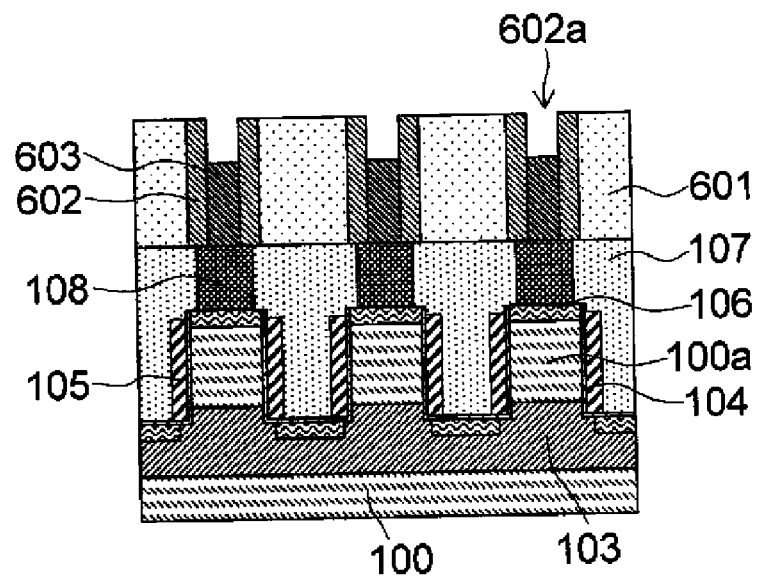
FIG. 34 is a process diagram (forming recess regions 602a) showing a manufacturing process of the memory cell MC according to the sixth embodiment.

Next, as shown in FIG. 34, the heater electrodes 603 are etched back, thereby causing upper surfaces of the heater electrodes 603 to be recessed from upper surfaces of the interlayer insulation films 601. It suffices that the recess amount is approximately 20 nm. With this arrangement, recess regions 602a are formed.

Figure 35:
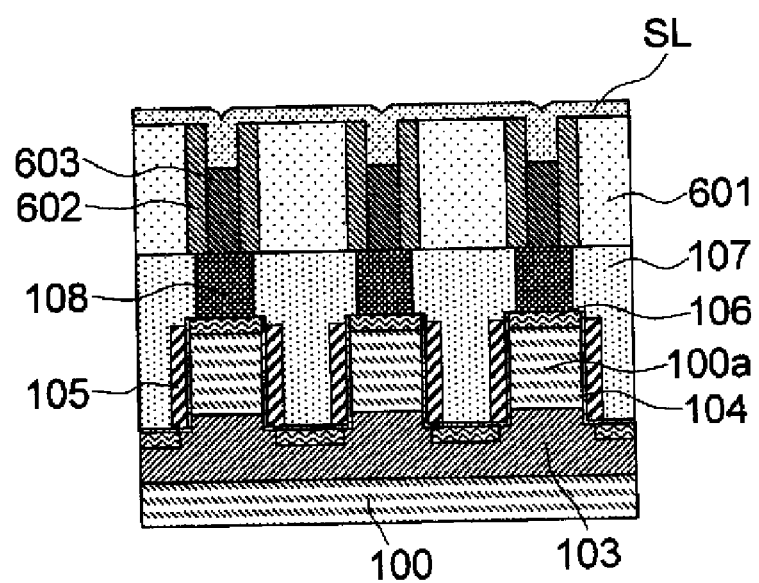
FIG. 35 is a process diagram (forming a superlattice laminate SL) showing a manufacturing process of the memory cell MC according to the sixth embodiment.

Next, the superlattice laminate SL is formed on the whole surface including the inside of the recess regions 602a as shown in FIG. 35. As a result, the superlattice laminate SL is laminated along the bottom surface and the inner wall of the recess regions 602a. In the sixth embodiment, the film thickness of the superlattice laminate SL is controlled such that the recess regions 602a are completely embedded with the superlattice laminate SL. It suffices that the superlattice laminate SL has a film thickness of approximately 10 nm.

Figure 36A:
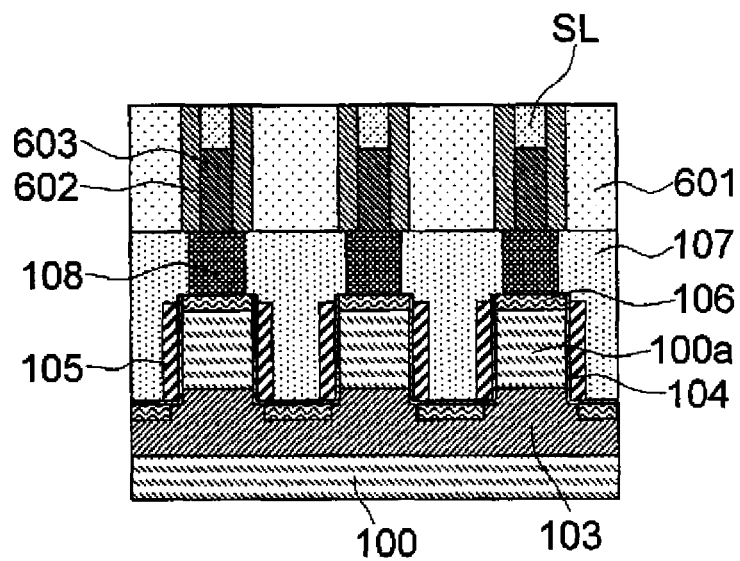
FIGS. 36A and 36B are process diagrams (polishing the superlattice laminate SL) showing a manufacturing process of the memory cell MC according to the sixth embodiment.
Figure 36B:
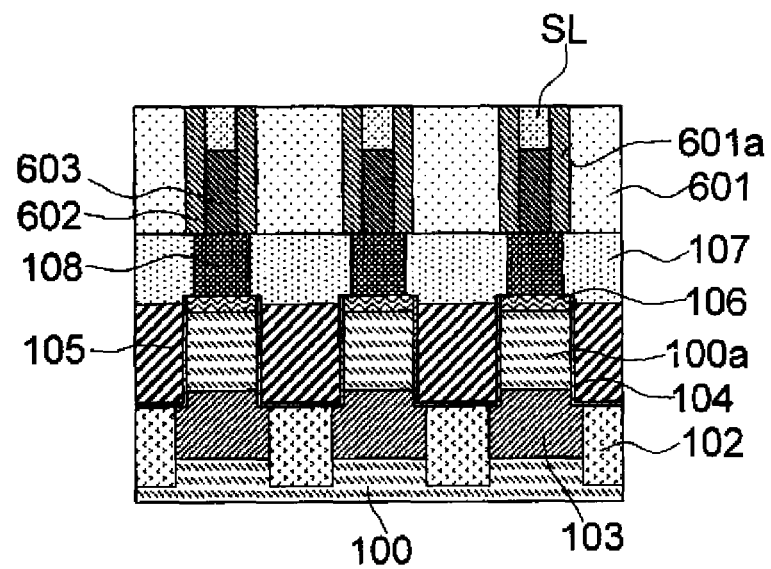

Next, the superlattice laminate SL is polished by the CMP method to expose the upper surface of the interlayer insulation film 601 as shown in FIGS. 36A and 36B. Accordingly, the superlattice laminates SL embedded in the recess regions 602a are isolated for each of the memory cells MC. A titanium nitride film is then formed by approximately 30 nm on the planarized interlayer insulation film 601, and this titanium nitride film is patterned to form the upper electrodes 604 extended to the Y direction. The memory cells MC according to the sixth embodiment are thus completed.

Next, a configuration of the memory cells MC according to a seventh embodiment of the present invention is explained next.

Figure 37A:
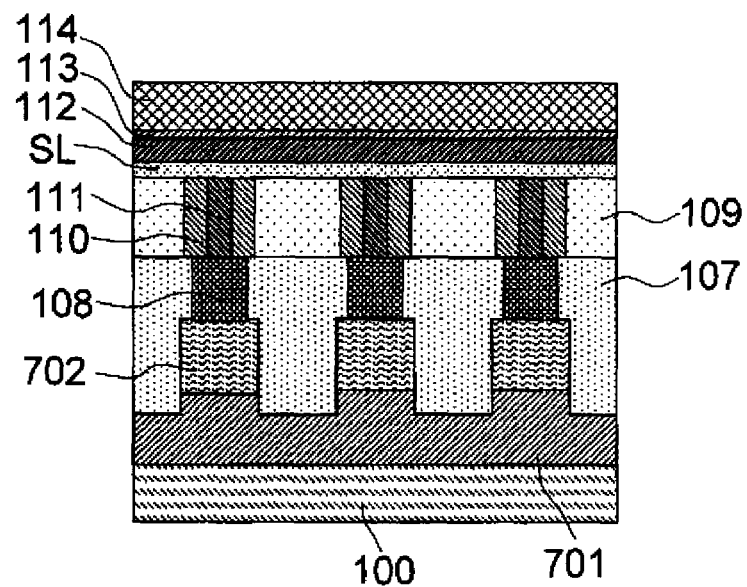
FIGS. 37A and 37B show a device configuration of the memory cells MC according to the seventh embodiment, where
Figure 37B:
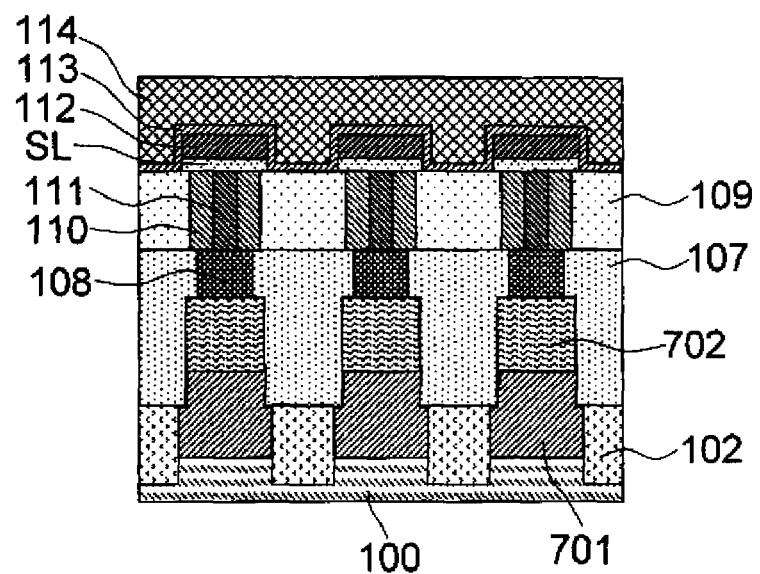

FIGS. 37A and 37B show a device configuration of the memory cells MC according to the seventh embodiment, where FIG. 37A is a schematic cross-sectional view along a bit line direction (the Y direction), and FIG. 37B is a schematic cross-sectional view along a word line direction (the X direction).

The memory cells MC shown in FIGS. 37A and 37B are different from the memory cells MC (according to the first embodiment) shown in FIGS. 7A and 7B, in that the MOS transistors as switching devices are replaced by diodes. Other features of the memory cells MC according to the seventh embodiment are identical to those of the first embodiment, and thus like elements are denoted by like reference numerals and redundant explanations thereof will be omitted.

In the seventh embodiment, N-type diffusion layers 701 are formed at lower parts of the silicon pillars 100a, and P-type diffusion layers 702 are formed at upper parts of the N-type diffusion layers 701. As a result, the P-type diffusion layers 702 and the N-type diffusion layers 701 form PN-junction diodes. As shown in FIGS. 37A and 37B, junction surfaces of the PN-junction diodes are provided within the silicon pillars 100a in parallel to the main surface of the semiconductor substrate 100. In the seventh embodiment, gate insulation films and gate electrodes are not necessary because a switching device is a diode.

According to the seventh embodiment, because diodes are used for switching devices, a larger ON current can be obtained than that when MOS transistors are used. Because a manufacturing process can be simplified as compared with that of vertical MOS transistors, manufacturing costs can be also reduced.

Figure 38:
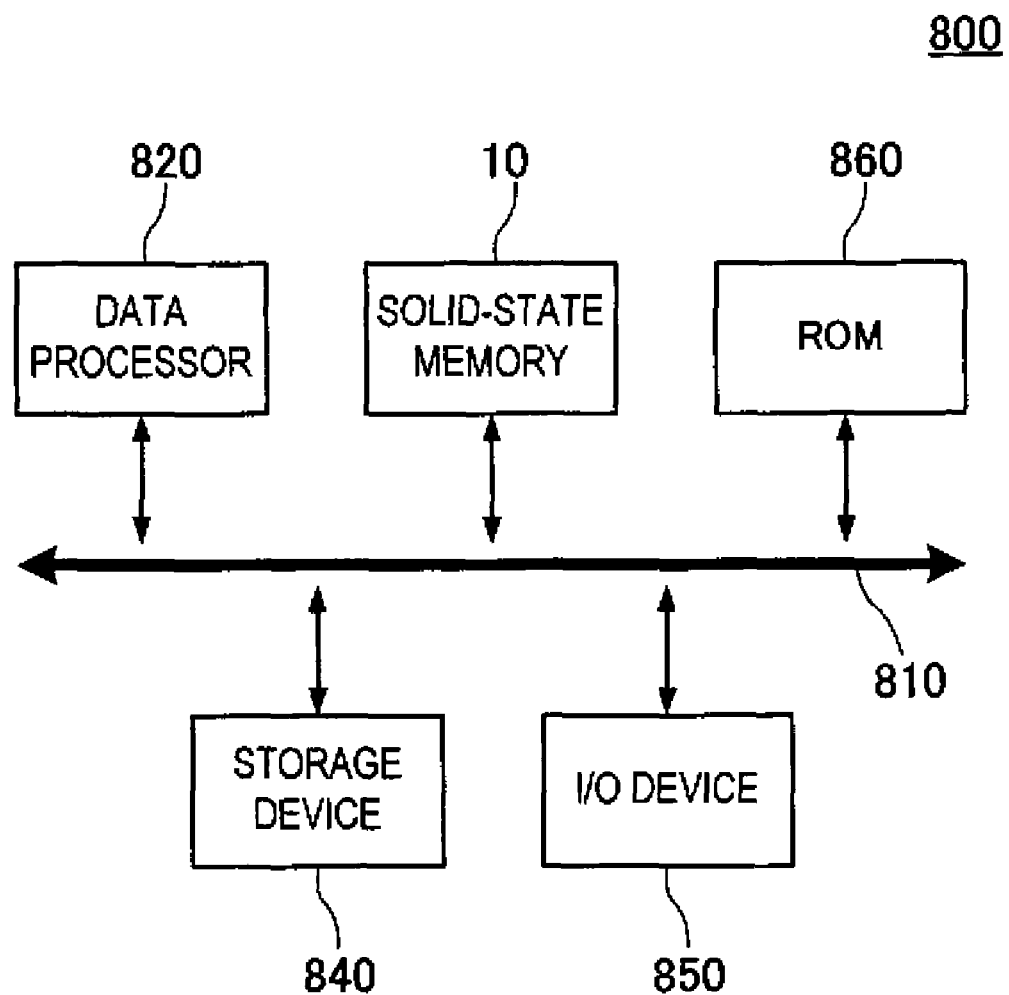
FIG. 38 is a block diagram showing a constitution of a data processing system 800 using a solid-state memory 10.

FIG. 38 is a block diagram showing a configuration of a data processing system 800 by using the solid-state memory device 10 shown in FIG. 1.

The data processing system 800 shown in FIG. 38 has a configuration that a data processor 820 and the solid-sate memory 10 shown in FIG. 1 are connected to each other via a system bus 810. A microprocessor (MPU) and a digital signal processor (DSP) are mentioned as the data processor 820, for example, but the digital processor is not limited thereto. In FIG. 38, although the data processor 820 and the solid-state memory device 10 are connected to each other via the system bus 810 to simplify the drawing, the data processor 820 and the solid-state memory device 10 can be connected to each other via a local bus without using the system bus 810.

Although only one set of the system bus 810 is shown in FIG. 38 to simplify the drawing, the system bus 810 can be also provided in series or in parallel via connectors or the like. In the data processing system 800 shown in FIG. 38, although a storage device 840, an I/O device 850, and a ROM 860 are connected to the system bus 810, these are not necessarily essential constituent elements in the present invention.

A hard disk drive, an optical disk drive, and a flash memory are mentioned as the storage device 840. A display device such as a liquid crystal display, and an input device such as a keyboard and a mouse are mentioned as the I/O device 850. Either one of an input device and an output device is sufficient as the I/O device 850. Although each one of the constituent elements is shown for simplification in FIG. 38, the number is not limited to one, and one or plural constituent elements can be also provided.

Figure 39:
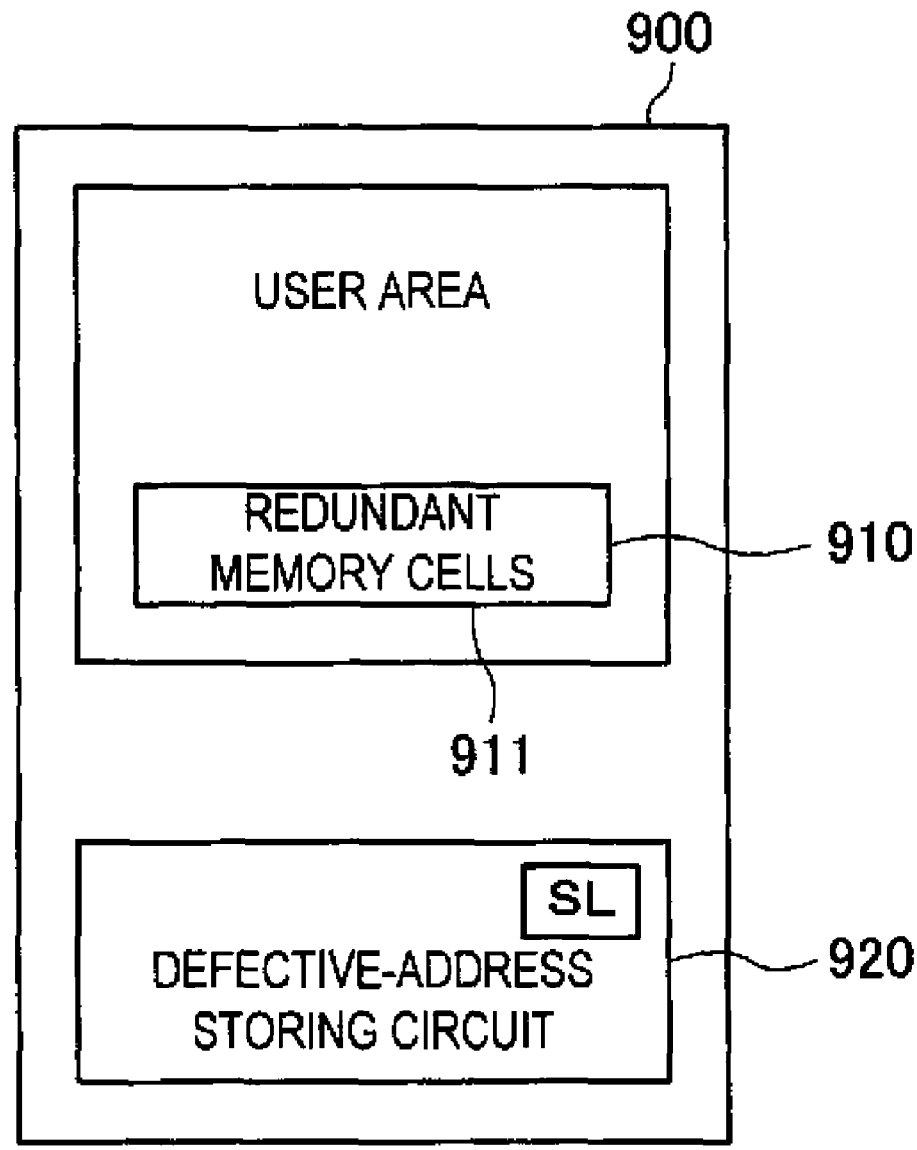
FIG. 39 is a block diagram of a solid-state memory 900 using the superlattice laminate SL shown in FIG. 3 for a defective-address storing circuit.

FIG. 39 is a block diagram of a solid-state memory device 900 using the superlattice laminate SL shown in FIG. 3 for a defective-address storing circuit.

The solid-state memory device 900 shown in FIG. 39 uses the superlattice laminate SL sandwiched between the electrodes 3 and 4 for a defective-address storing circuit 920 that stores a defective address contained in a user area 910. The user area 910 is a memory region rewritable by a user. A DRAM cell, an SRAM cell, and a flash memory are mentioned as kinds of memory cells. A defective address is sometimes found in these memory cells at a manufacturing stage. A memory cell corresponding to a detected defective memory cell is replaced by a redundant memory cell 911. The defective address is relieved by this. The defective-address storing circuit 920 stores this defective address. In the example shown in FIG. 39, the superlattice laminate SL is used for a memory constituting the defective-address storing circuit 920. The memory cell using this superlattice laminate SL can be used for a memory cell in other than the user area 910.

Figure 40:
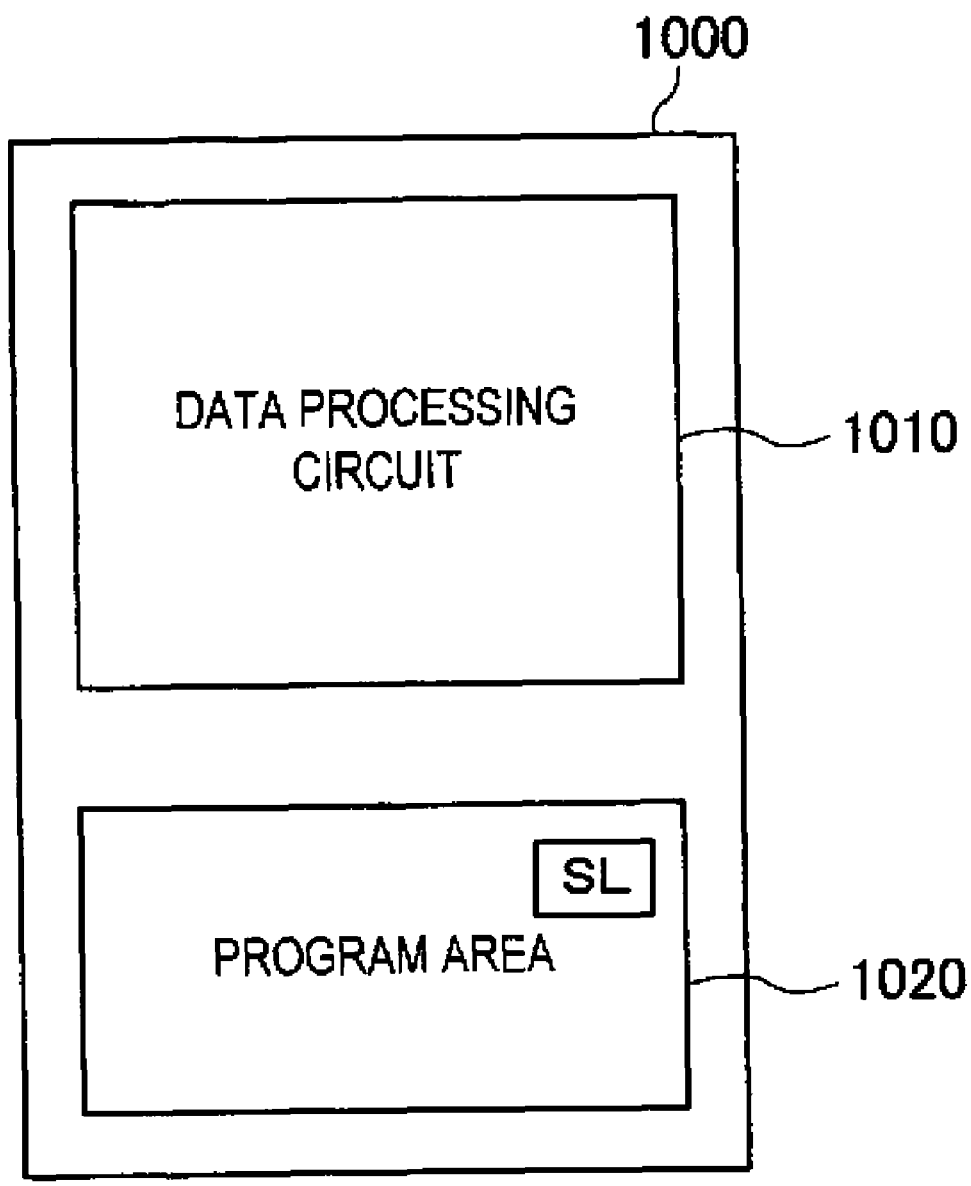
FIG. 40 is a block diagram of a data processing device 1000 using the superlattice laminate SL shown in FIG. 3 in a program area.

FIG. 40 is a block diagram of a data processing device 1000 using the superlattice laminate SL shown in FIG. 3 in a program area.

The data processing device 1000 shown in FIG. 40 includes a program area 1020 provided in a data processing circuit 1010 such as a CPU. The data processing circuit 1010 performs a predetermined operation based on a program held in the program area 1020. The data processing device 1000 shown in FIG. 40 uses the superlattice laminate SL sandwiched between the electrodes 3 and 4 for a memory cell constituting the program area 1020. As explained above, a memory cell using the superlattice laminate SL can be also used for a memory cell included in a device other than a memory device.

It is apparent that the present invention is not limited to the above embodiments, but may be modified and changed without departing from the scope and spirit of the invention.

Further, although the superlattice laminate 10 according to the above embodiment has a configuration that the crystal layer 1 and the crystal layer 2 are alternately laminated, the number of laminated layers is not particularly limited. It suffices that at least the underlaying layer of the crystal layer 1 is the orientation layer 3 and also that the crystal layer 2 is formed on an upper surface of the crystal layer 1. Therefore, each of the crystal layer 1 and the crystal layer 2 can be in one layer.

Furthermore, the names of the "upper electrode" and the "lower electrode" do not define any physical positional relationship. An electrode to which a power source is connected is called the "upper electrode", and an electrode which is grounded is called the "lower electrode", only for the sake of convenience. Therefore, the "upper electrode" simply means one of a pair of electrodes, and the "lower electrode" simply means the other one of the pair of electrode.

What is claimed is:

1. A solid-state memory device comprising:
   first and second electrodes arranged to a first direction; and
   a superlattice laminate sandwiched between the first and second electrodes, the superlattice laminate having a plurality of crystal layers laminated one another, the crystal layers including first and second crystal layers having mutually different compositions, wherein
   at least a part of the superlattice laminate has an interface of the first and second crystal layers that intersects with the first direction, and
   the first crystal layer included in the superlattice laminate comprises a phase change material.

2. The solid-state memory device as claimed in claim 1, further comprising a first interlayer insulation film in which the first electrode is embedded, wherein
   the superlattice laminate is provided on the first interlayer insulation film.

3. The solid-state memory device as claimed in claim 2, further comprising a sidewall insulation film that covers an inner wall of a first through-hole formed in the first interlayer insulation film, wherein
   the first electrode is provided in a region surrounded by the sidewall insulation film.

4. The solid-state memory device as claimed in claim 2, wherein a laminated surface of the superlattice laminate is a flat surface.

5. The solid-state memory device as claimed in claim 2, further comprising a second interlayer insulation film provided on the first interlayer insulation film, wherein the second interlayer insulation film has a second through-hole, and
a laminated surface of the superlattice laminate is provided along a bottom surface and an inner wall of the second through-hole.

6. The solid-state memory device as claimed in claim 5, wherein at least a part of the second electrode is provided in a region surrounded by the superlattice laminate.

7. The solid-state memory device as claimed in claim 5, wherein the second through-hole is filled with the superlattice laminate.

8. The solid-state memory device as claimed in claim 5, wherein the second through-hole has a tapered shape such that an internal diameter becomes smaller toward the first electrode.

9. The solid-state memory device as claimed in claim 1, further comprising:
   a first interlayer insulation film having a first through-hole; and
   a sidewall insulation film that covers an inner wall of the first through-hole, wherein
   the first electrode and the superlattice laminate are provided in a region surrounded by the sidewall insulation film.

10. The solid-state memory device as claimed in claim 1, wherein at least apart of the second electrode has a convex shape such that a diameter becomes smallest at a portion nearest the first electrode.

11. The solid-state memory device as claimed in claim 1, further comprising a protection insulation film that covers an end surface in a direction along a laminated surface of the superlattice laminate.

12. The solid-state memory device as claimed in claim 1, wherein the first crystal layer included in the superlattice laminate has a crystal state reversibly changed by an electric energy given from the first and second electrodes.

13. The solid-state memory device as claimed in claim 1, wherein the first crystal layer included in the superlattice laminate has positions of constituent atoms reversibly replaced by an electric energy given from the first and second electrodes.

14. The solid-state memory device as claimed in claim 13, wherein the first crystal layer comprises a chalcogen compound containing germanium (Ge) and tellurium (Te) as main components.

15. The solid-state memory device as claimed in claim 14, wherein the first crystal layer comprises a chalcogen compound containing germanium (Ge) and tellurium (Te) at a rate of substantially 1:1, and a crystal state of the first crystal layer is reversibly transited between a first crystal structure in which one germanium atom is orientated to four tellurium atoms and a second crystal structure in which one germanium atom is orientated to six tellurium atoms, based on a movement of a germanium atom due to energy application.

16. The solid-state memory device as claimed in claim 13, wherein the second crystal layer comprises a chalcogen compound containing antimony (Sb) and tellurium (Te) as main components.

17. The solid-state memory device as claimed in claim 16, wherein
   the superlattice laminate has a configuration such that the first crystal layer and the second crystal layer are alternately laminated repeatedly at plural times, and
   among the second crystal layers, a second crystal layer nearest the first electrode has a larger film thickness than that of other second crystal layers.

18. The solid-state memory device as claimed in claim 13, further comprising:
a write circuit that moves a position of a constituent atom of the first crystal layer by flowing a write current to the superlattice laminate via the first and second electrodes; and
a read circuit that flows a read current to the superlattice laminate via the first and second electrodes without moving a position of a constituent atom of the first crystal layer.

19. The solid-state memory device as claimed in claim 18, wherein the write circuit includes a set circuit that causes the first crystal layer to change from a first crystal structure to a second crystal structure, and a reset circuit that causes the first crystal layer to change from the second crystal structure to the first crystal structure.

20. The solid-state memory device as claimed in claim 1, further comprising a switching device electrically connected to the first electrode, wherein
the switching device comprises a vertical MOS transistor having a silicon pillar that serves as a channel region, and
the silicon pillar is projected in a direction perpendicular to a main surface of a semiconductor substrate.

21. The solid-state memory device as claimed in claim 1, further comprising a switching device electrically connected to the first electrode, wherein
the switching device comprises a diode having at least one of an anode and a cathode being formed in a silicon pillar, and
the silicon pillar is projected in a direction perpendicular to a main surface of a semiconductor substrate.

22. A data processing system comprising:
a solid-state memory device;
a data processor; and
a system bus that connects the solid-state memory device to the data processor,
wherein a memory cell included in the solid-state memory device comprises:
first and second electrodes arranged to a first direction; and
a superlattice laminate sandwiched between the first and second electrodes, the superlattice laminate having a plurality of crystal layers laminated one another, the crystal layers including first and second crystal layers having mutually different compositions, wherein
at least a part of the superlattice laminate has an interface of the first and second crystal layers that intersects with the first direction, and
the first crystal layer included in the superlattice laminate comprises a phase change material.

23. A solid-sate memory comprising:
a data-rewritable user area; and
a defective-address storing circuit that stores a defective address included in the user area,
wherein a memory cell included in the defective-address storing circuit comprises:
first and second electrodes arranged to a first direction; and
a superlattice laminate sandwiched between the first and second electrodes, the superlattice laminate having a plurality of crystal layers laminated one another, the crystal layers including first and second crystal layers having mutually different compositions, wherein
at least a part of the superlattice laminate has an interface of the first and second crystal layers that intersects with the first direction, and
the first crystal layer included in the superlattice laminate comprises a phase change material.

24. A data processing device comprising:
a program area; and
a data processing circuit that performs a predetermined operation in accordance with a program stored in the program area,
wherein a memory cell included in the program area comprises:
first and second electrodes arranged to a first direction; and
a superlattice laminate sandwiched between the first and second electrodes, the superlattice laminate having a plurality of crystal layers laminated one another, the crystal layers including first and second crystal layers having mutually different compositions, wherein
at least a part of the superlattice laminate has an interface of the first and second crystal layers that intersects with the first direction, and
the first crystal layer included in the superlattice laminate comprises a phase change material.

* * * * *